(12) United States Patent
Imamura et al.

(10) Patent No.: US 11,762,021 B2
(45) Date of Patent: Sep. 19, 2023

(54) MONITORING DEVICE FOR ELECTRIC VEHICLES

(71) Applicant: Mitsubishi Electric Corporation, Tokyo (JP)

(72) Inventors: Yasutaka Imamura, Tokyo (JP); Yuta Matsumoto, Tokyo (JP); Hisanori Yamasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 686 days.

(21) Appl. No.: 16/627,519

(22) PCT Filed: Jul. 4, 2017

(86) PCT No.: PCT/JP2017/024543
§ 371 (c)(1),
(2) Date: Dec. 30, 2019

(87) PCT Pub. No.: WO2019/008682
PCT Pub. Date: Jan. 10, 2019

(65) Prior Publication Data
US 2020/0166575 A1 May 28, 2020

(51) Int. Cl.
*G01R 31/34* (2020.01)
*G07C 5/08* (2006.01)

(52) U.S. Cl.
CPC ......... *G01R 31/343* (2013.01); *G07C 5/0808* (2013.01)

(58) Field of Classification Search
CPC ...... G01R 31/343; G07C 5/0808; G07C 5/08; B61C 17/00
See application file for complete search history.

(56) References Cited

U.S. PATENT DOCUMENTS 8,712,618 B2 * 4/2014 Kono .............. B60L 3/0023
701/22
2017/0369084 A1 12/2017 Goda et al.

FOREIGN PATENT DOCUMENTS

DE 112015005994 B4 7/2021
JP 2005057817 A 3/2005
(Continued)

OTHER PUBLICATIONS

Office Action dated Jul. 3, 2021, for corresponding Indian Patent Application No. 201927054246, 6 pages.
(Continued)

*Primary Examiner* — Joseph J Dallo
(74) *Attorney, Agent, or Firm* — BUCHANAN INGERSOLL & ROONEY PC

(57) ABSTRACT

A monitoring device for an electric vehicle to monitor a blower for cooling a device installed in an electric vehicle includes: a dq-component separation unit that separates an instantaneous value of a motor current that flows to a motor of the blower into a d-axis current component and a q-axis current component; a mechanical-angle rotation-frequency component extraction unit that extracts a mechanical-angle rotation frequency component from an instantaneous value of the q-axis current component, the mechanical-angle rotation frequency component being a rotation frequency component where a rotation angle of the motor is expressed in a mechanical angle; and an abnormality determination unit that determines whether or not the blower is abnormal on the basis of magnitude of the mechanical-angle rotation frequency component.

20 Claims, 15 Drawing Sheets

(56) References Cited

FOREIGN PATENT DOCUMENTS

| | | |
|---|---|---|
| JP | 2005219568 A | 8/2005 |
| JP | 4197653 B2 | 12/2008 |
| JP | 2015148516 A | 8/2015 |
| WO | WO-2014156386 A1 * | 10/2014 ........... G01R 19/165 |
| WO | 2016117025 A1 | 7/2016 |

OTHER PUBLICATIONS

Office Action dated Dec. 9, 2021, issued in corresponding German Patent Application No. 112017007728.1, 58 pages including 29 pages of English Translation.
International Search Report (PCT/ISA/210), with translation, and Written Opinion KPCT/ISA/237) dated Sep. 26, 2017, by the Japan Patent Office as the International Searching Authority for International Application No. PCT/JP2017/024543.

* cited by examiner

MONITORING DEVICE FOR ELECTRIC VEHICLES

FIELD

The present invention relates to a monitoring device and a monitoring system for an electric vehicles, which monitor an air blower that cools a device installed in an electric vehicle.

BACKGROUND

Various types of devices that require to be cooled are installed in an electric vehicle. Examples of the various types of devices include an electric-vehicle driving motor, an electric-vehicle driving main transformer, and a power converter that controls the electric-vehicle driving motor. These devices are often provided with a cooling blower.

Patent Literature 1 listed below discloses a monitoring device for electric vehicles. The monitoring device includes a means for detecting a motor current that flows to a motor of a blower, a means for detecting a motor application voltage to be applied to the motor of the blower, a means for detecting an amount of power that is the product of the motor current and the motor application voltage, and an abnormality detection means for detecting reverse rotation of the motor of the blower and a decrease in the air amount of the blower on the basis of information of the power amount.

CITATION LIST

Patent Literature

Patent Literature 1: Japanese Patent No. 4197653

SUMMARY

Technical Problem

In an electric vehicle, a blower that cools a power converter and a blower that cools an electric-vehicle driving motor are placed under the floor of the vehicle. As a general method for monitoring these blowers, maintenance personnel performs visual confirm and an abnormal-sound check in a rolling stock depot. When there is a possibility of an abnormality in the blower, the maintenance personnel performs an operation check in the rolling stock depot to check whether or not the blower is abnormal. Accordingly, monitoring blowers has been a costly inspection work which requires a considerable amount of time for determining whether or not the blower is abnormal. The said "abnormality"/"abnormal" includes rotary malfunction of a motor of the blower due to the motor's clogging and irregular sound due to dust unevenly distributed therein.

The monitoring device described in Patent Literature 1 mentioned above has an advantage in that determination about abnormality of the blower can be performed during an operation of an electric vehicle. However, the technique in Patent Literature 1 is merely directed to abnormality determination using information limited to the power amount. For this reason, even though degradation in performance of the blower can be detected, it is still difficult to accurately detect an abnormality in the blower.

The present invention has been devised in view of the above circumstances, and its object is to provide a monitoring device for an electric vehicle, which can accurately detect an abnormality in a blower.

Solution to Problem

In order to solve the above-mentioned problems and achieve the object, the present invention a monitoring device for an electric vehicle to monitor a blower for cooling a device installed in an electric vehicle, the monitoring device comprising: an extraction unit to extract a mechanical-angle rotation frequency component from a plurality of frequency components included in state information indicating a rotational state of a motor of the blower, the mechanical-angle rotation frequency component being a rotation frequency component where a rotation angle of the motor is expressed in a mechanical angle; and an abnormality determination unit to determine whether or not the blower is abnormal on the basis of magnitude of the mechanical-angle rotation frequency component.

Advantageous Effects of Invention

The monitoring device for an electric vehicle according to the present invention has an advantageous effect that an abnormality of a blower can be accurately detected.

DESCRIPTION OF EMBODIMENTS

A monitoring device and a monitoring system for electric vehicles according to embodiments of the present invention will be described in detail below with reference to the accompanying drawings. The present invention is not necessarily limited by the following embodiments. In the following descriptions, electrical connection between constituent elements is simply referred to as "connection".

First Embodiment

Figure 1:
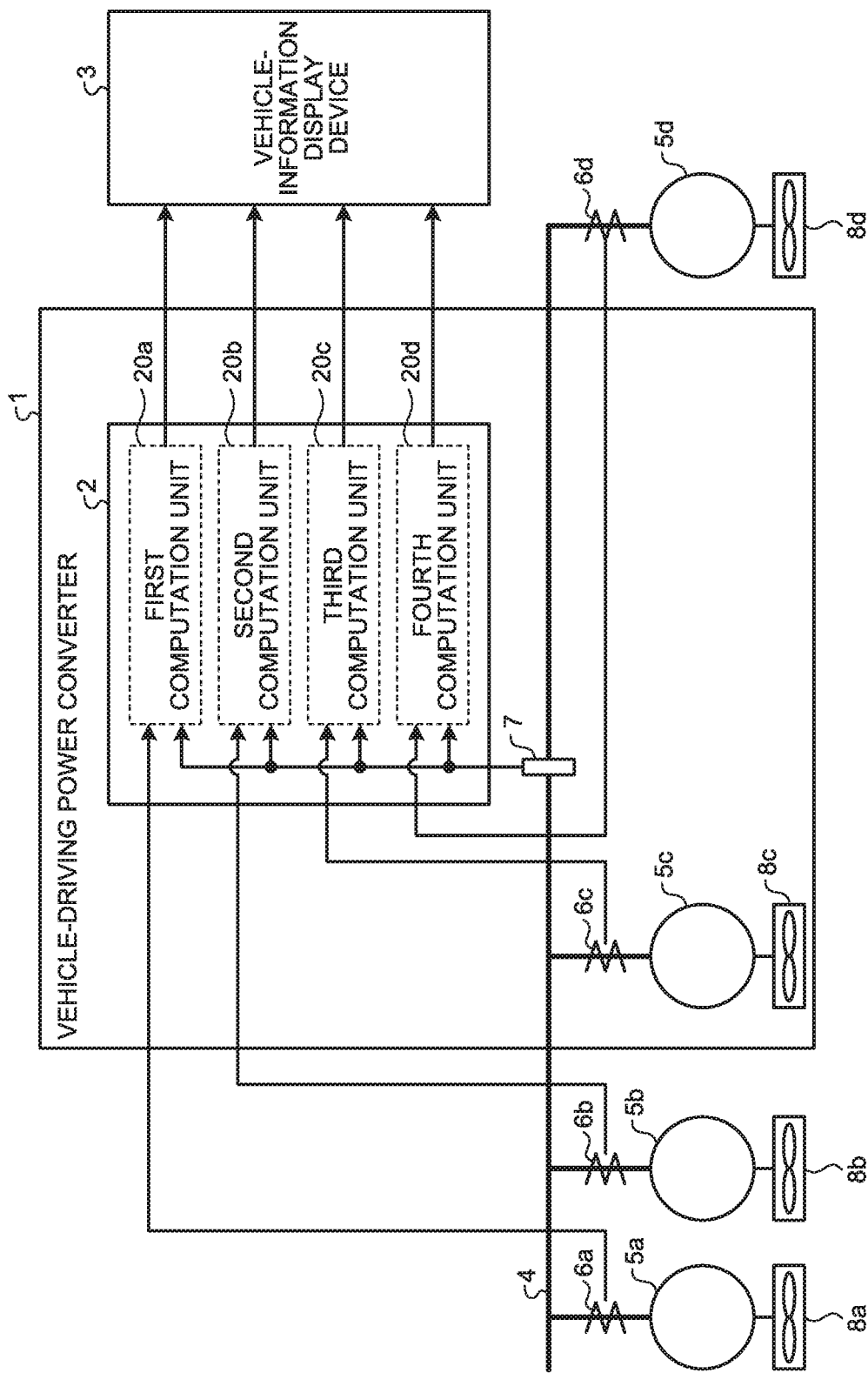
FIG. 1 is a diagram illustrating a configuration of an electric vehicle, which is used to explain a monitoring system for an electric vehicle according to a first embodiment.
Figure 2:
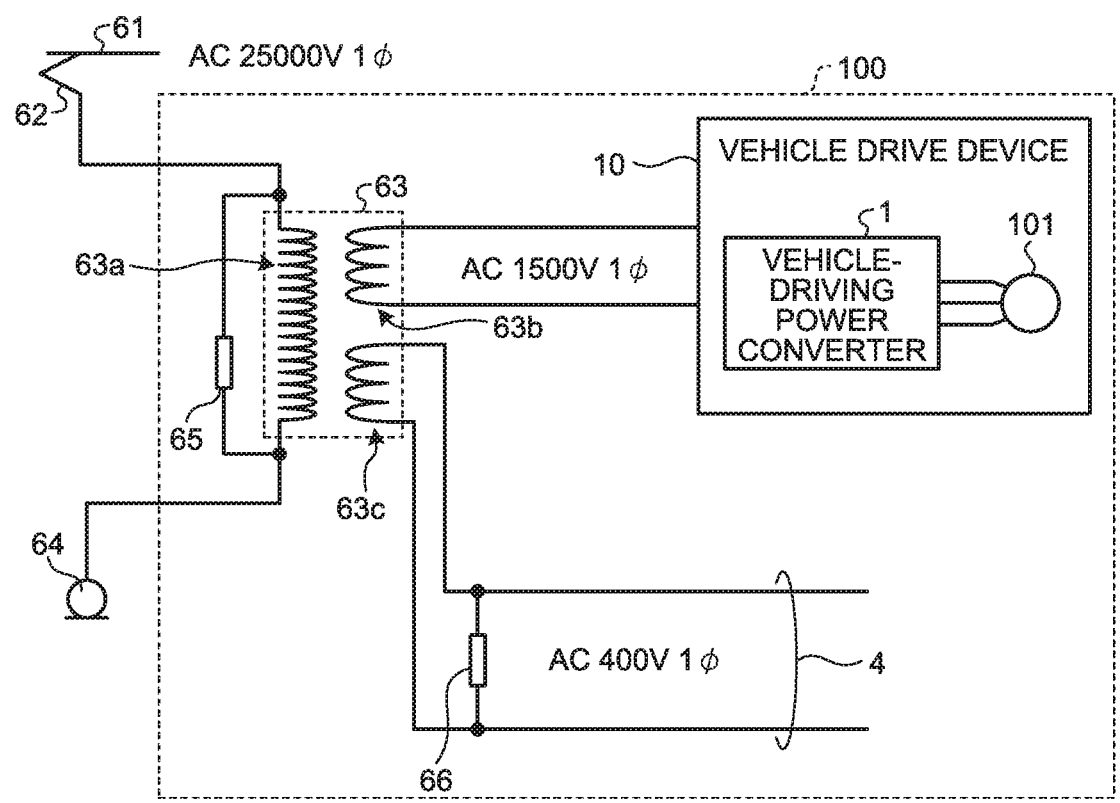
FIG. 2 is an explanatory diagram of a power facility that supplies an electric power to an electric vehicle.

FIG. 1 is a diagram illustrating a configuration of an electric vehicle 100, which is used to explain a monitoring system for an electric vehicle according to a first embodiment. FIG. 2 is an explanatory diagram of a power facility that supplies an electric power to the electric vehicle 100.

In FIG. 1, the electric vehicle 100 includes a vehicle-driving power converter 1 and a vehicle-information display device 3. The vehicle-information display device 3 is a device having a function of displaying vehicle information. An example of the vehicle-information display device 3 is a vehicle-information management device. The vehicle-information management device is a general designation for a device that manages vehicle information. The vehicle information includes information related to control commands for the electric vehicle 100, such as a power running command, a brake command, and a speed command, and includes state information such as a vehicle speed, a motor current, a motor application voltage, and a motor instantaneous power. The motor instantaneous power is the product of an instantaneous value of the motor current and an instantaneous value of the motor application voltage. The motor current, the motor application voltage, and the motor instantaneous power are state information indicating the rotational state of a motor of a blower. Information on mechanical vibration of the motor, in an embodiment described later, is also state information indicating the rotational state of the motor of the blower. Another example of the vehicle-information display device 3 is a driver's cab display device. The driver's cab display device is installed in a conductor's vehicle of the electric vehicles, which is a device configured to make it possible for a crew member to check vehicle information and traffic information.

In FIG. 2, the electric vehicle 100 includes a vehicle-driving main transformer 63 and a vehicle drive device 10. The vehicle drive device 10 includes the vehicle-driving power converter 1 and a vehicle driving motor 101. The vehicle-driving power converter 1 illustrated in FIG. 2 is the vehicle-driving power converter 1 illustrated in FIG. 1. The vehicle-driving main transformer 63, the vehicle-driving power converter 1, and the vehicle driving motor 101 are examples of devices that require to be cooled.

In FIG. 2, the notation "AC 25000V 1$\phi$" means that an overhead contact line voltage is a single-phase Alternating Current voltage of 25000 V. Voltages described below also follow this notation manner. In notation for other drawings, "DC" means Direct Current, and "3$\phi$" means three phases.

The vehicle-driving main transformer 63 includes a primary winding 63a, a secondary winding 63b, and a tertiary winding 63c. The primary winding 63a, the secondary winding 63b, and the tertiary winding 63c are magnetically coupled with each other. The secondary winding 63b and the tertiary winding 63c are auxiliary windings of the vehicle-driving main transformer 63, and are each referred to as a "main-transformer auxiliary winding".

One end of the primary winding 63a is connected to a current collector 62, while the other end of the primary winding 63a is connected to a wheel 64. A voltage of an overhead contact line 61 is applied to the primary winding 63a via the current collector 62. The voltage of the overhead contact line 61 is referred to as "overhead contact line voltage" case by case. As described above, the overhead contact line voltage is a single-phase Alternating Current voltage of 25000 V.

A voltage detector 65 is connected to the opposite ends of the primary winding 63a. The voltage detector 65 detects the overhead contact line voltage. Information on the overhead contact line voltage detected by the voltage detector 65 is transmitted to the vehicle-information display device 3 illustrated in FIG. 1. The information on the overhead contact line voltage is also one of some kinds of vehicle information.

The secondary winding 63b is connected to the vehicle drive device 10. A single-phase Alternating Current voltage of 1500 V is generated on the secondary winding 63b. The voltage generated by the secondary winding 63b is applied to the vehicle drive device 10.

A power wire 4 is connected to the tertiary winding 63c. A single-phase Alternating Current voltage of 400 V is generated on the tertiary winding 63c. The voltage generated by the tertiary winding 63c is applied to the power wire 4. A voltage detector 66 is connected to opposite ends of the tertiary winding 63c. The voltage detector 66 detects the voltage generated by the tertiary winding 63c.

Referring back to FIG. 1, the power wire 4 is laid on in the electric vehicle 100. The electric vehicle 100 is provided with a first motor 5a, a second motor 5b, a third motor 5c, and a fourth motor 5d, as well as air blowers 8a, 8b, 8c, and 8d. The first motor 5a, the second motor 5b, the third motor 5c, and the fourth motor 5d are connected to the power wire 4. The first motor 5a is a motor to drive the blower 8a that cools the vehicle-driving main transformer 63. The second motor 5b is a motor to drive the blower 8b that cools the vehicle driving motor 101. The third motor 5c is a motor to drive the blower 8c that cools the vehicle-driving power converter 1. The fourth motor 5d is a motor to drive the blower 8d that cools the vehicle driving motor 101. In a general electric vehicle, there are two vehicle driving motors per vehicle. With corresponding to this configuration, FIG.

1 illustrates two blowers 8*b* and 8*d*, and the second motor 5*b* and the fourth motor 5*d* that drive these two blowers 8*b* and 8*d*, respectively.

The vehicle-driving power converter 1 includes a computation unit 2. The computation unit 2 performs various types of computation processing necessary for controlling the vehicle driving motor 101. Various types of computation processing include a process of computing a voltage to be applied to the vehicle driving motor 101, a process of computing a torque current and an excitation current to be flowed to the vehicle driving motor 101, a process related to start up and stoppage of the vehicle driving motor 101, and a process of transmitting operation information of the vehicle driving motor 101 to the vehicle-information display device 3.

A voltage detector 7 is located on the power wire 4. The voltage detector 7 detects a voltage to be applied to the power wire 4. The voltage to be applied to the power wire 4 is equivalent to a voltage to be applied to the first motor 5*a*, the second motor 5*b*, the third motor 5*c*, and the fourth motor 5*d*. The voltage to be applied to the first motor 5*a*, the second motor 5*b*, the third motor 5*c*, and the fourth motor 5*d* is referred to as a "motor application voltage" case by case. The motor application voltage detected by the voltage detector 7 is transmitted to the computation unit 2.

In the power wire 4, a current detector 6*a* is located on an electric line connecting the power wire 4 and the first motor 5*a*. The current detector 6*a* detects a current flowing in the first motor 5*a*. Similarly, a current detector 6*b* is located on an electric line connecting the power wire 4 and the second motor 5*b*. The current detector 6*b* detects a current flowing in the second motor 5*b*. Similarly, a current detector 6*c* is located on an electric line connecting the power wire 4 and the third motor 5*c*. The current detector 6*c* detects a current flowing in the third motor 5*c*. Similarly, a current detector 6*d* is located on an electric line connecting the power wire 4 and the fourth motor 5*d*. The current detector 6*d* detects a current flowing in the fourth motor 5*d*.

A current that flows in each of the first motor 5*a*, the second motor 5*b*, the third motor 5*c*, and the fourth motor 5*d* is referred to as a "motor current" case by case. The motor current detected by each of the current detectors 6*a*, 6*b*, 6*c*, and 6*d* is transmitted to the computation unit 2.

The computation unit 2 includes a first computation unit 20*a*, a second computation unit 20*b*, a third computation unit 20*c*, and a fourth computation unit 20*d*. The first computation unit 20*a*, the second computation unit 20*b*, the third computation unit 20*c*, and the fourth computation unit 20*d* are distinguished from each other for the sake of convenience. The computation units may be configured to include their respective individual parts, or may be configured to share a common part for them.

A motor application voltage detected by the voltage detector 7 and a motor current detected by the current detector 6*a* are inputted to the first computation unit 20*a*. A motor application voltage detected by the voltage detector 7 and a motor current detected by the current detector 6*b* are inputted to the second computation unit 20*b*. A motor application voltage detected by the voltage detector 7 and a motor current detected by the current detector 6*c* are inputted to the third computation unit 20*c*. A motor application voltage detected by the voltage detector 7 and a motor current detected by the current detector 6*d* are inputted to the fourth computation unit 20*d*.

Each of the first computation unit 20*a*, the second computation unit 20*b*, the third computation unit 20*c*, and the fourth computation unit 20*d* performs computation described later on the basis of information on the inputted motor application voltage and information on the inputted motor current. Results of the computation in the first computation unit 20*a*, the second computation unit 20*b*, the third computation unit 20*c*, and the fourth computation unit 20*d* are transmitted to the vehicle-information display device 3.

Figure 3:
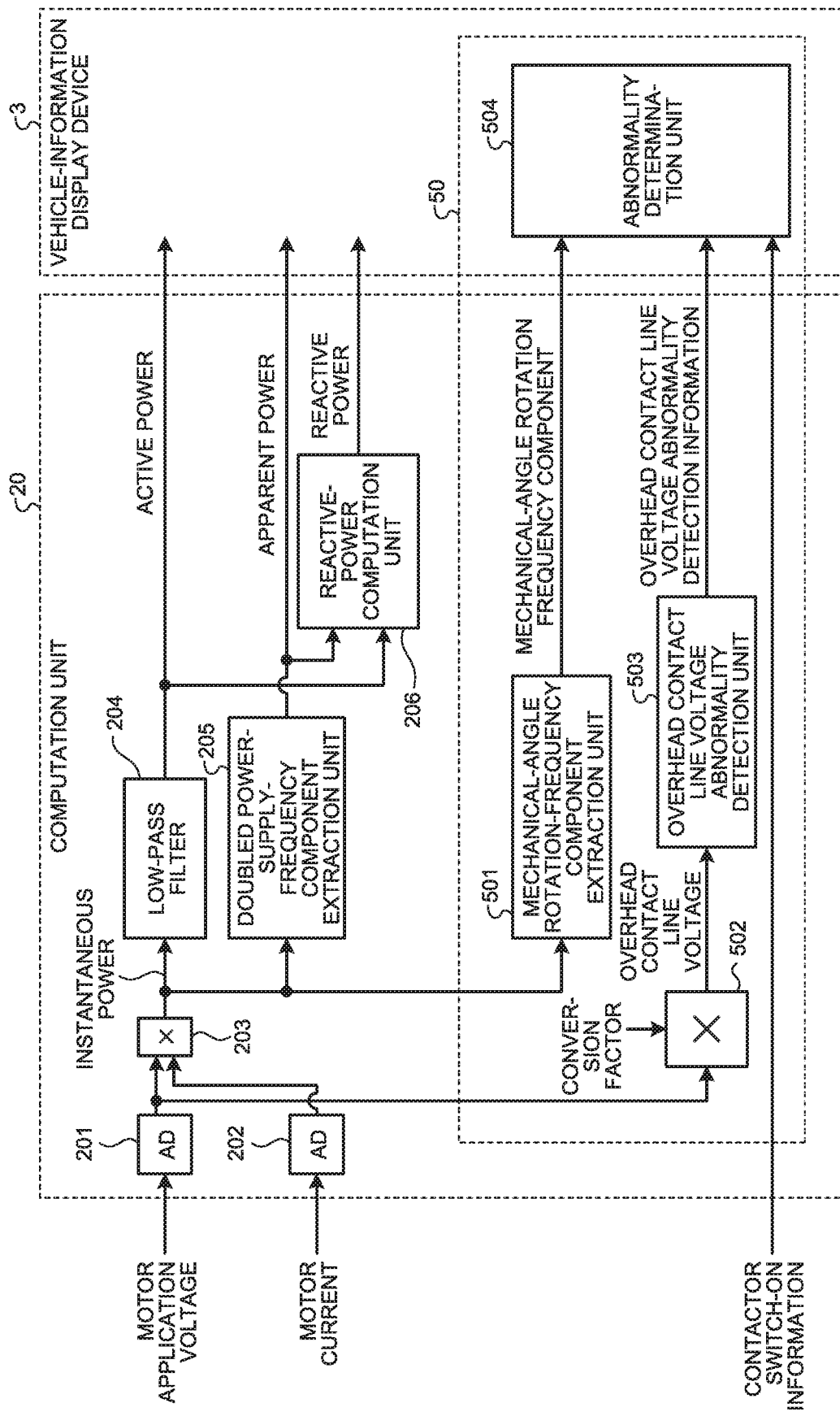
FIG. 3 is a block diagram illustrating a detailed configuration of a computation unit illustrated in FIG. 1.

FIG. 3 is a block diagram illustrating a detailed configuration of the computation unit 2 illustrated in FIG. 1. FIG. 3 illustrates a computation unit 20 as one of the first computation unit 20*a*, the second computation unit 20*b*, the third computation unit 20*c*, and the fourth computation unit 20*d* which are illustrated in FIG. 1.

The computation unit 20 includes an Analogue Digital (hereinafter, expressed as "AD") converter 201, an AD converter 202, a multiplier 203, a low-pass filter 204, a doubled power-supply-frequency component extraction unit 205, a reactive-power computation unit 206, a mechanical-angle rotation-frequency component extraction unit 501, a multiplier 502, and an overhead contact line voltage abnormality detection unit 503. The vehicle-information display device 3 includes an abnormality determination unit 504. The "mechanical-angle rotation-frequency component extraction unit" is sometimes referred simply to as "extraction unit". When expression is made just using "extraction unit", this refers to the "mechanical-angle rotation-frequency component extraction unit".

Of the constituent elements of the computation unit 20 illustrated in FIG. 30, the AD converter 201, the AD converter 202, the multiplier 203, the low-pass filter 204, the doubled power-supply-frequency component extraction unit 205, and the reactive-power computation unit 206 are constituent elements for performing computation processing necessary for controlling the vehicle driving motor 101. On the other hand, the mechanical-angle rotation-frequency component extraction unit 501, the multiplier 502, and the overhead contact line voltage abnormality detection unit 503 are additional constituent elements for realizing a function of the monitoring system according to the first embodiment. That is, a monitoring system 50 for an electric vehicle according to the first embodiment is constructed of: the mechanical-angle rotation-frequency component extraction unit 501, the multiplier 502, and the overhead contact line voltage abnormality detection unit 503 which are added to the computation unit 20; and the abnormality determination unit 504 added to the vehicle-information display device 3.

The monitoring system 50 for an electric vehicle is a system that monitors the operations of the first motor 5*a*, the second motor 5*b*, the third motor 5*c*, and the fourth motor 5*d*. The monitoring system 50 for an electric vehicle monitors the operations of the first motor 5*a*, the second motor 5*b*, the third motor 5*c*, and the fourth motor 5*d*, to thereby monitor individual blowers having these motors installed therein, respectively.

A motor application voltage and a motor current are inputted to the computation unit 20. Contactor switch-on information is inputted to the vehicle-information display device 3 via the computation unit 20. It is allowable that the contactor switch-on information is inputted to the vehicle-information display device 3 without intervention of the computation unit 20.

The computation unit 20 conventionally has a function of generating information on an active power, an apparent power, and a reactive power. The control system in FIG. 3 is configured to use this function. The information on an active power, an apparent power, and a reactive power generated in the computation unit 20 is transmitted to the vehicle-information display device 3.

Next, the functions of the computation unit 20 are described. A motor application voltage is converted to a digital value by the AD converter 201, and the value is then inputted to the multiplier 203. A motor current is converted to a digital value by the AD converter 202, and the value is then inputted to the multiplier 203. The multiplier 203 multiplies the motor application voltage and the motor current to generate an instantaneous power.

As illustrated in the figure, the active power is generated by passing the instantaneous power through the low-pass filter 204. The apparent power is generated by passing the instantaneous power through the doubled power-supply-frequency component extraction unit 205. The reactive power is generated by passing the active power and the apparent power through the reactive-power computation unit 206. Each of these functions of the low-pass filter 204, the doubled power-supply-frequency component extraction unit 205, and the reactive-power computation unit 206 can be implemented by using a publicly-known technique. Therefore, detailed descriptions of these functions are omitted.

The mechanical-angle rotation-frequency component extraction unit 501 uses an instantaneous power generated by the multiplier 203 to extract a mechanical-angle rotation frequency component that is a rotation frequency component where the rotation angle of the motor is expressed as a mechanical angle. The mechanical angle is equivalent to a rotation angle about a rotational axis of the motor. A term opposed to "mechanical angle" is an electrical angle. The electrical angle is an angle used to represent a rotation angle where change in an input Alternating-Current voltage for one cycle is 360°. There is the following relation between an electrical-angle frequency by which the frequency is represented in electrical angle and a mechanical-angle rotation frequency.

Electrical-angle frequency=number of pole pairs×
mechanical-angle frequency

A mechanical-angle rotation frequency component extracted by the mechanical-angle rotation-frequency component extraction unit 501 is inputted to the abnormality determination unit 504.

The multiplier 502 multiplies the motor application voltage by a conversion factor to generate an overhead contact line voltage. The overhead contact line voltage abnormality detection unit 503 detects an abnormality in the overhead contact line voltage on the basis of information on the overhead contact line voltage generated by the multiplier 502. The overhead contact line voltage abnormality detection information that is a result of the detection of whether or not the overhead contact line voltage is abnormal is inputted to the abnormality determination unit 504. In FIG. 3, an overhead contact line voltage is computed using information on the motor application voltage. However, the present invention is not limited to this configuration. Assuming that the vehicle-information display device 3 holds therein information on an overhead contact line voltage, the information from the vehicle-information display device 3 can be received. In a case where the vehicle-information display device 3 holds therein information on an overhead contact line voltage, it is allowable to provide the overhead contact line voltage abnormality detection unit 503 in the vehicle-information display device 3.

Figure 4:
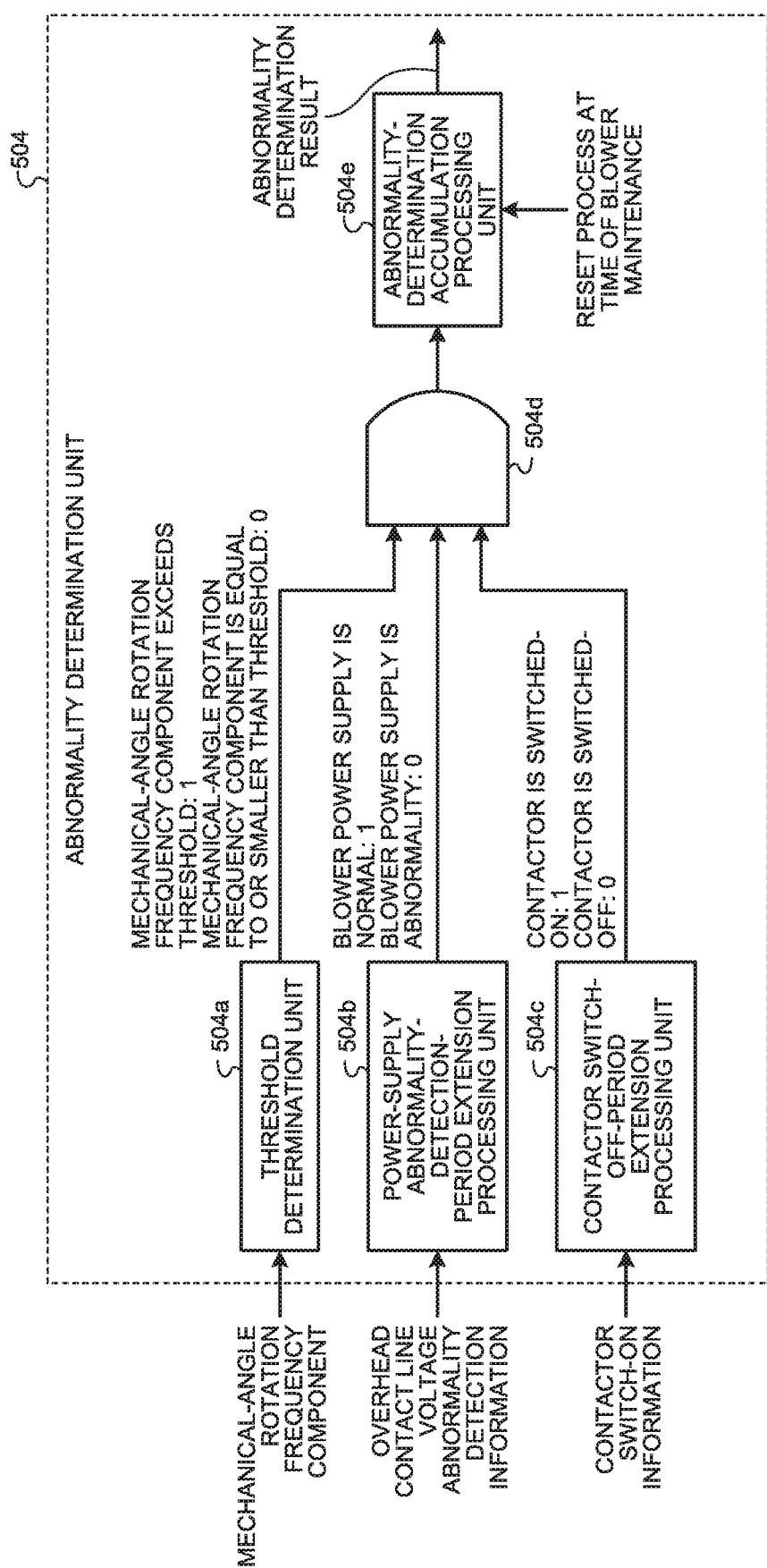
FIG. 4 is a block diagram illustrating a functional configuration of an abnormality determination unit illustrated in FIG. 3.

Next, an operation of the abnormality determination unit 504 is described. FIG. 4 is a block diagram illustrating a functional configuration of the abnormality determination unit 504 illustrated in FIG. 3.

As illustrated in FIG. 4, the abnormality determination unit 504 includes a threshold determination unit 504a, a power-supply abnormality-detection-period extension processing unit 504b that is a first extension processing unit, a contactor switch-off-period extension processing unit 504c that is a second extension processing unit, a logical multiplication circuit 504d, and an abnormality-determination accumulation processing unit 504e.

The threshold determination unit 504a compares a mechanical-angle rotation frequency component with a preset threshold. When the mechanical-angle rotation frequency component exceeds the threshold, the threshold determination unit 504a outputs a logic "1". When the mechanical-angle rotation frequency component is equal to or smaller than the threshold, the threshold determination unit 504a outputs a logic "0". A result of the determination in the threshold determination unit 504a is inputted to the logical multiplication circuit 504d.

Even when the overhead contact line voltage abnormality detection information indicates a change from abnormality to normality, the power-supply abnormality-detection-period extension processing unit 504b still continues to output a logic "0" that is a signal indicating that there is an abnormality in a blower power supply, during a preset first period. The first period is a period during which rotation of the blower becomes stabilized and the process of extracting the mechanical-angle rotation frequency component becomes stabilized. Because the power-supply abnormality-detection-period extension processing unit 504b continues to output a logic "0" during a period for which a logic "1" is to be outputted, this becomes equivalent to a process in which the power-supply abnormality detection period is extended. The first period is set to approximately 5 to 10 seconds depending on the type of the overhead contact line. During the first period, a logic "0" is continuously outputted to the logical multiplication circuit 504d, so that the abnormality determination in the logical multiplication circuit 504d remains pending.

On the other hand, when the overhead contact line voltage abnormality detection information indicates a normality thereof after the lapse of the first period, the power-supply abnormality-detection-period extension processing unit 504b outputs a logic "1". A result of the processing in the power-supply abnormality-detection-period extension processing unit 504b is inputted to the logical multiplication circuit 504d.

Even when the contactor switch-on information indicates a change from switch-off to switch-on, the contactor switch-off-period extension processing unit 504c still continues to output a logic "0" that is a signal indicating that there is an abnormality in a blower power supply, during a preset second period. The second period is a period during which rotation of the blower becomes stabilized and the process of extracting the mechanical-angle rotation frequency component becomes stabilized. Because the contactor switch-off-period extension processing unit 504c continues to output a logic "0" during a period for which a logic "1" is to be outputted, this becomes equivalent to a process in which the contactor switch-off period is extended. The second period is set to approximately 5 to 10 seconds depending on the type of the contactor. During the second period, a logic "0" is continuously outputted to the logical multiplication circuit 504d, so that the abnormality determination in the logical multiplication circuit 504d remains pending.

On the other hand, when the contactor switch-on information indicates a switch-on state after the lapse of the second period, the contactor switch-off-period extension processing unit 504c outputs a logic "1". A result of the processing in the contactor switch-off period extension processing unit 504c is inputted to the logical multiplication circuit 504d.

The logical multiplication circuit 504d outputs a logic "1" only when all of the three inputs thereof are logic "1s". In contrast, the logical multiplication circuit 504d outputs a logic "0" when at least one of the three inputs is a logic "0". A result of the computation in the logical multiplication circuit 504d is inputted to the abnormality-determination accumulation processing unit 504e.

When an output of the logical multiplication circuit 504d is a logic "1", this indicates that there is a possibility that a determination-target blower is abnormal. However, if it is determined that it is abnormal only depending on information indicating that an output of the logical multiplication circuit 504d is a logic "1", a false alarm is more likely to be issued. For this reason, the abnormality-determination accumulation processing unit 504e is provided.

The abnormality-determination accumulation processing unit 504e accumulates outputs of the logical multiplication circuit 504d, and performs an abnormality determination of the blower on the basis of the accumulated results. Any method may be used as long as the abnormality-determination accumulation processing unit 504e uses a plurality of outputs of the logical multiplication circuit 504d. For example, when a value of the integral obtained by integrating outputs of the logical multiplication circuit 504d with respect to fixed intervals exceeds a threshold, the abnormality-determination accumulation processing unit 504e can determine that there is an abnormality in the blower. The fixed interval is, for example, one minute. It is also allowable to determine that the blower is abnormal when the number of times of outputs of logic "1s" exceeds a threshold value during a given period. It is further allowable to determine that the blower is abnormal when a ratio of the number of times of outputs of logic "1s" to the number of times of outputs of logic "1s" in a motor of another blower exceeds a threshold value during a given period. The given period is, for example, five minutes. Alternatively, instead of these manners, a statistical method may be used.

When an abnormal part is removed by maintenance and inspection on, repair for, or replacement of a blower, a reset process is executed. A result of the determination in the abnormality-determination accumulation processing unit 504e is cleared by the reset process.

Figure 5:
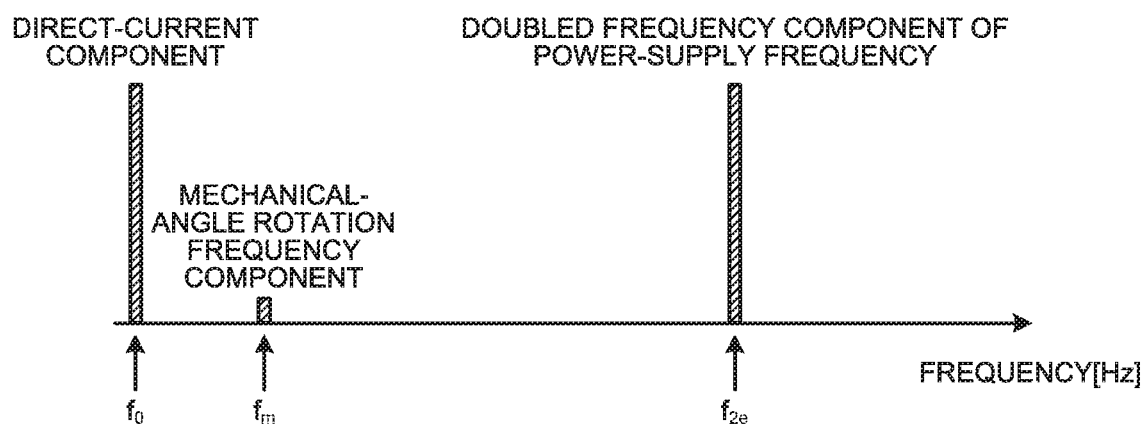
FIG. 5 is a chart schematically illustrating frequency components that appear when frequency analysis is performed on a motor instantaneous electric power.
Figure 6:
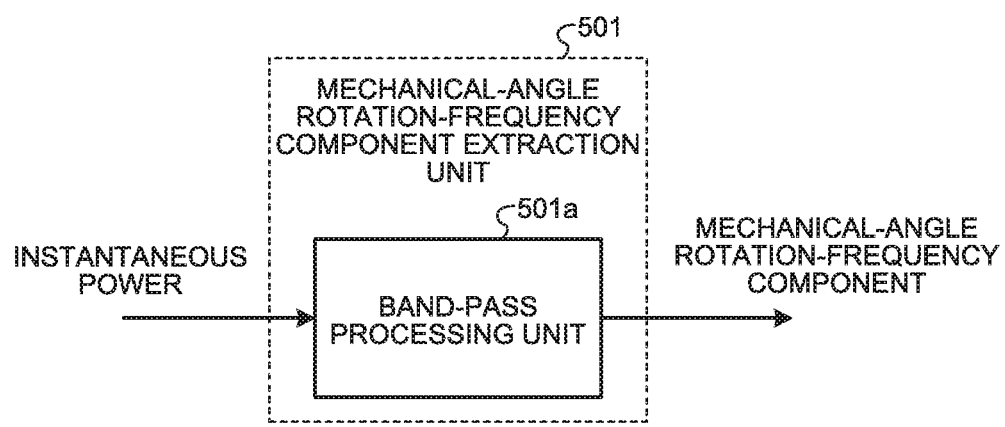
FIG. 6 is a block diagram illustrating a configuration example of a mechanical-angle rotation-frequency component extraction unit illustrated in FIG. 3.
Figure 7:
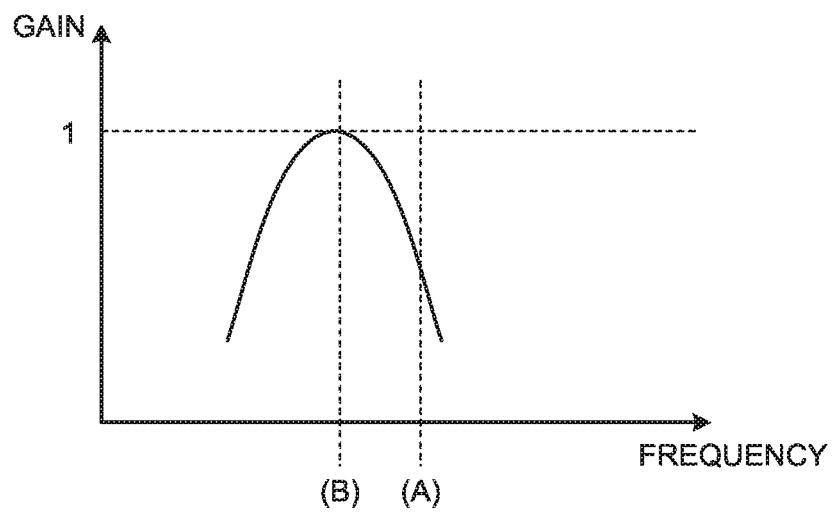
FIG. 7 is a chart illustrating filter characteristics of the mechanical-angle rotation-frequency component extraction unit illustrated in FIG. 3.

Next, processing in the mechanical-angle rotation-frequency component extraction unit 501 is described in detail with reference to the drawings of FIGS. 5 to 7. FIG. 5 is a chart schematically illustrating frequency components that appear when frequency analysis is performed on a motor instantaneous power. FIG. 6 is a block diagram illustrating a configuration example of the mechanical-angle rotation-frequency component extraction unit 501 illustrated in FIG. 3. FIG. 7 is a chart illustrating filter characteristics of the mechanical-angle rotation-frequency component extraction unit 501 illustrated in FIG. 3.

When frequency analysis is performed on an instantaneous power supplied to the motor of the blower, a Direct-Current component $f_0$, a mechanical-angle rotation frequency component $f_m$, and a doubled frequency component $f_{2e}$ of the power-supply frequency appear as illustrated in FIG. 5. The Direct-Current component $f_0$ is one of the components that show a change in active power over time.

The mechanical-angle rotation frequency component $f_m$ is one of the components that show a mechanical anomaly. When an anomaly has occurred in a bearing of the motor of the blower, the mechanical-angle rotation frequency component $f_m$ becomes greater. Also when dust that accumulates in a blade part of the blower is unevenly distributed, the mechanical-angle rotation frequency component $f_m$ becomes greater. The unevenly distributed dust may inhibit smooth rotation of the motor of the blower, and rotation sound of the motor of the blower may become louder. Therefore, use of the mechanical-angle rotation frequency component $f_m$ enables detection of an anomaly in the motor of the blower.

In the first embodiment in which a power supply used for operation is a single-phase power supply, the doubled frequency component $f_{2e}$ of the power-supply frequency is a frequency component that is also present during a normal operation. In a case where the power-supply frequency is 50 Hz, the doubled frequency component fee of the power-supply frequency is 100 Hz.

As illustrated in FIG. 6, the mechanical-angle rotation-frequency component extraction unit 501 includes a band-pass processing unit 501a. The band-pass processing unit 501a performs a band-pass filtering process. FIG. 7 illustrates filter characteristics of the band-pass processing unit 501a when the motor of the blower is an induction motor. In FIG. 7, a frequency (A) is expressed by the following equation.

$$\text{Frequency } (A) = \text{power-supply frequency/the number of pole pairs} \quad (1)$$

In FIG. 7, a frequency (B) is a center frequency of the band-pass processing unit 501a. The frequency (B) is expressed by the following equation.

$$\text{Frequency } (B) = (\text{power-supply frequency} - \text{rated slip frequency})/\text{the number of pole pairs} \quad (2)$$

In the above equation (2), the rated slip frequency is a slip frequency when the motor is operated with a rated torque. When a slip value is 0, the slip frequency is equal to the power-supply frequency. It is allowable to use a slip frequency obtained when the motor is operated under a rated-load condition, instead of the rated slip frequency. The rated-load condition corresponds to a particular operational condition that serves as a calculation criterion. The rated-load condition is often defined by a rated current and a rated voltage. It is further allowable to use a value of a slip frequency measured in advance under a condition in which the device has been operated.

In a case of using an induction motor with the number of pole pairs being two, where the power-supply frequency is 50 Hz, and the rated slip frequency is 2 Hz, the frequency (B) is calculated as (50−2)/2=24 Hz while the frequency (A) is calculated as 50/2=25 Hz. There is a difference of 1 Hz between the frequency (A) and the frequency (B). There is a gain difference of 10 dB or lower between the frequency (B) and the frequency (A). It is understood from the above that FIG. 7 illustrates steep filter characteristics. Use of such steep filter characteristics enables accurate detection of an abnormality in the motor of the blower.

The foregoing has been directed to the case where the motor of the blower is an induction motor, but the method described in the first embodiment is also applicable to a synchronous motor. In the case of a synchronous motor, it is sufficient that the center frequency of the band-pass processing unit 501a is set as the frequency (A) calculated by the above equation (1).

Figure 8:
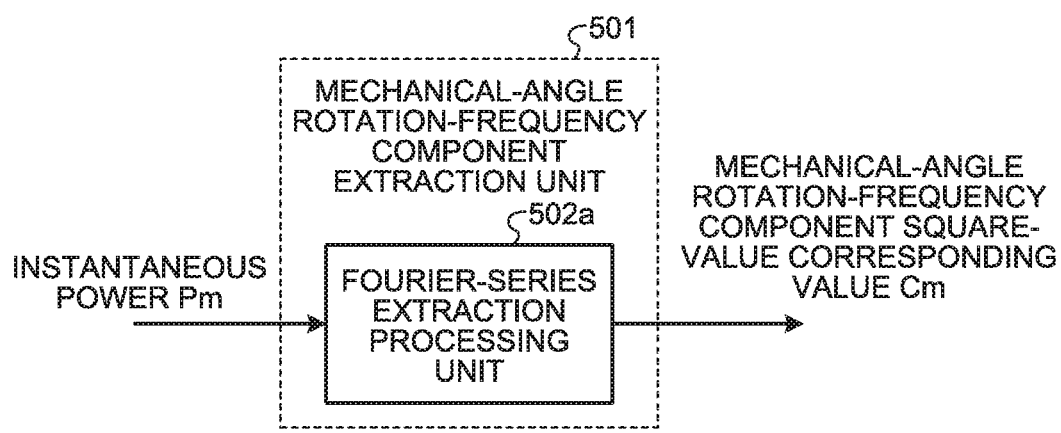
FIG. 8 is a block diagram illustrating a configuration example of a mechanical-angle rotation-frequency component extraction unit, which is different from the configuration example illustrated in FIG. 6.

FIG. 8 is a block diagram illustrating a configuration example of the mechanical-angle rotation-frequency component extraction unit 501, which is different from the configuration example illustrated in FIG. 6. The mechanical-angle rotation-frequency component extraction unit 501 includes a Fourier-series extraction processing unit 502a. The Fourier-series extraction processing unit 502a expresses an input instantaneous power Pm in a Fourier series, and extracts a mechanical-angle rotation frequency component using the following equations (3) to (5).

[Formula 1]
$$Am = \sum_{t=ts}^{ts+Tm} \frac{Pm \cdot \cos(2\pi \cdot fm \cdot t)}{Tm} \quad (3)$$

[Formula 2]
$$Bm = \sum_{t=ts}^{ts+Tm} \frac{Pm \cdot \sin(2\pi \cdot fm \cdot t)}{Tm} \quad (4)$$

[Formula 3]
$$Cm = Am^2 + Bm^2 \quad (5)$$

In the above equations (3) and (4), $f_m$ represents a mechanical-angle frequency calculated by the above equation (1), Tm represents the inverse of the mechanical-angle frequency fm, and ts represents the calculation start time. The Fourier-series extraction processing unit 502a performs Fourier-series extraction computation in which a prescribed frequency is determined, the prescribed frequency having a value calculated by dividing a frequency obtained by subtracting either a slip frequency obtained when the motor is operated under a rated-load condition or a rated slip frequency of the induction motor from the power-supply frequency, by the number of pole pairs of the induction motor. Cm that is an output of the Fourier-series extraction processing unit 502a can be obtained by summing the square value of Am obtained by the equation (3) and the square value of Bm obtained by the equation (4).

According to a strict definition of Fourier series, the absolute value of frequency spectrum is obtained by computing the square root of the sum of the square value of a sine-function component and the square value of a cosine-function component. On the other hand, in the present computation processing, computation of the square root is omitted as expressed by the equation (5). That is, in the present computation processing, a square value corresponding value Cm in the Fourier-series computation is calculated and set as a mechanical-angle rotation frequency component. In a case where the square value corresponding value Cm is used, the processing illustrated in FIG. 4 can be applied to this example by changing the determination threshold to a value corresponding to the square value corresponding value Cm. The computation amount in the mechanical-angle rotation-frequency component extraction unit 501 can be reduced if the present computation processing is used. Therefore, it is possible to minimize an increase in the processing load on the vehicle-information display device 3.

The monitoring system 50 for an electric vehicle according to the first embodiment extracts a mechanical-angle rotation frequency component $f_m$ from a plurality of frequency components included in state information indicating the rotational state of a motor of a blower, the mechanical-angle rotation frequency component $f_m$ being a rotation frequency component where the rotation angle of the motor is expressed in a mechanical angle. The monitoring system 50 also determines whether or not the blower is abnormal on the basis of the magnitude of the extracted mechanical-angle rotation frequency component $f_m$. This makes it possible to accurately detect an abnormality in the motor of the blower.

Second Embodiment

Figure 9:
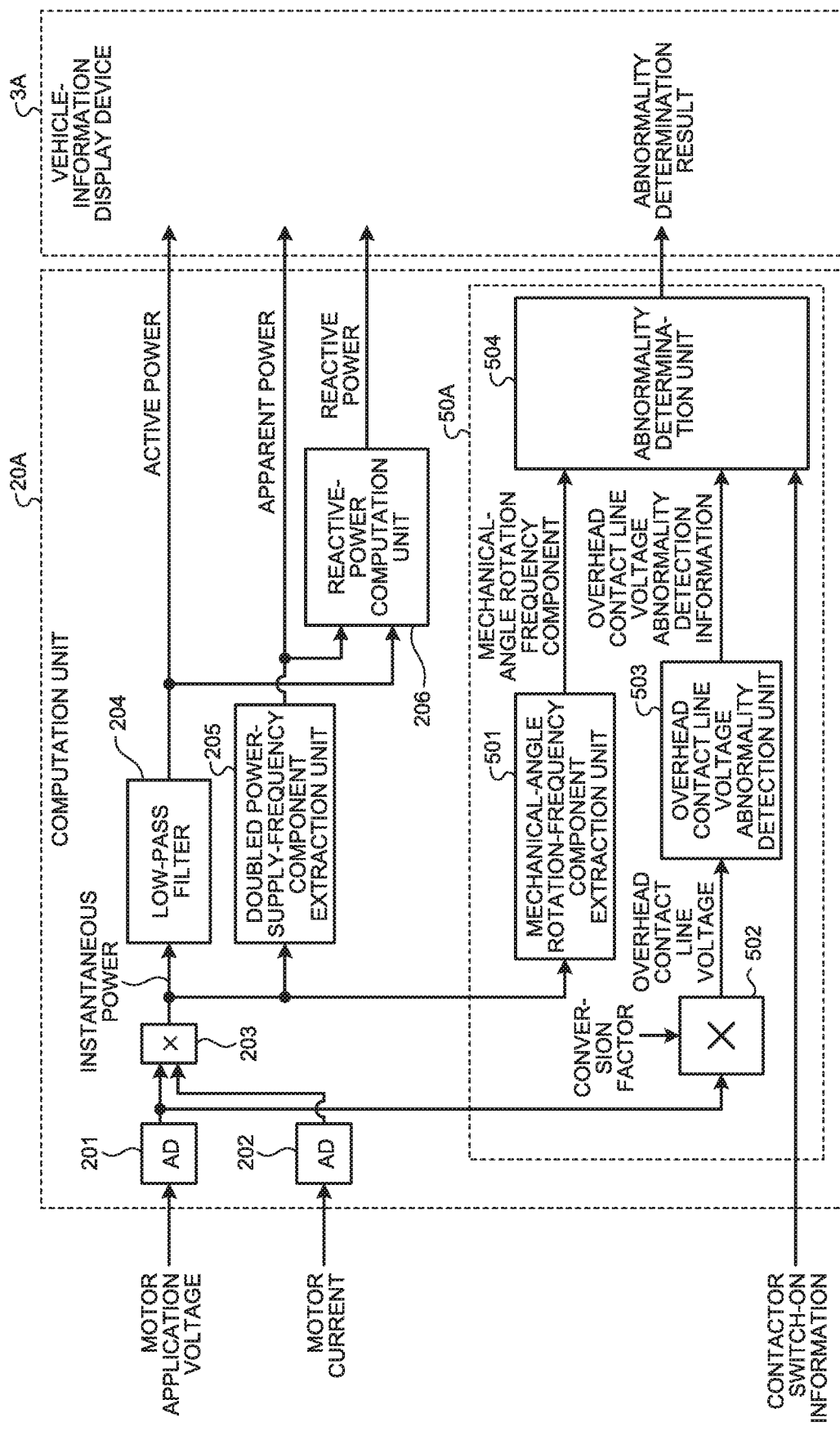
FIG. 9 is an explanatory diagram of a monitoring device for an electric vehicle according to a second embodiment.

FIG. 9 is an explanatory diagram of a monitoring device 50A for an electric vehicle according to a second embodiment. In the first embodiment, the abnormality determination unit 504 performing abnormality determination on the air blower is provided in the vehicle-information display device 3. In the second embodiment, however, the abnormality determination unit 504 performing abnormality determination on the air blower is included in a computation unit 20A.

In FIG. 9, the monitoring system 50A for an electric vehicle according to the second embodiment is constituted by the mechanical-angle rotation-frequency component extraction unit 501, the multiplier 502, the overhead contact line voltage abnormality detection unit 503, and the abnormality determination unit 504, which are provided in the computation unit 20A. Components that are identical or equivalent to those according to the first embodiment are denoted by like reference signs, and redundant descriptions thereof are omitted.

Figure 10:
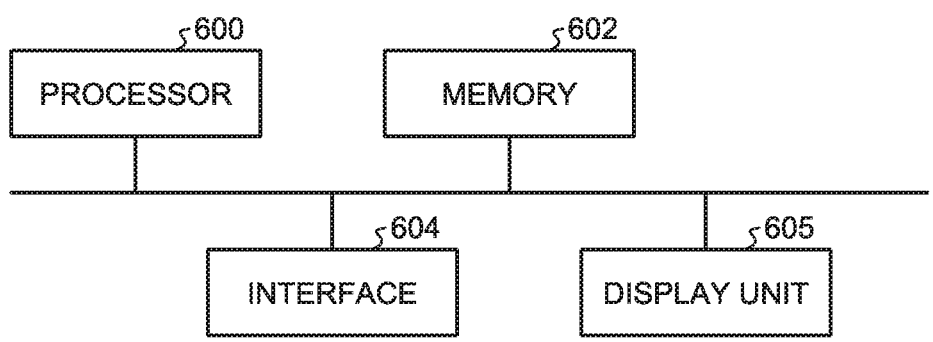
FIG. 10 is a block diagram illustrating an example of a hardware configuration for implementing a function of a computation unit in the second embodiment.
Figure 11:
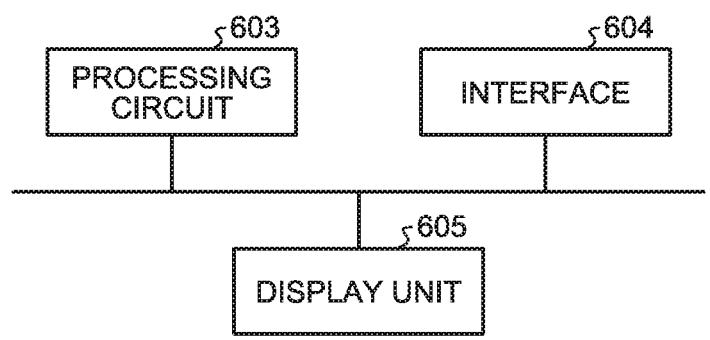
FIG. 11 is a block diagram illustrating an example of a hardware configuration for implementing the functions of the computation unit according to the second embodiment, which is different from the hardware configuration example illustrated in FIG. 10.

FIG. 10 is a block diagram illustrating an example of a hardware configuration for implementing a function of the computation unit 20A. FIG. 11 is a block diagram illustrating an example of a hardware configuration for implementing a function of the computation unit 20A, which is different from the hardware configuration example illustrated in FIG. 10.

In order to implement the functions of the computation unit 20A, use can be made of a configuration including: a processor 600 that performs computation; a memory 602 that stores therein a program to be read by the processor 600; an interface 604 to perform input and output of a signal; and a display unit 605 for displaying a result of the processing in the processor 600, as illustrated in FIG. 10.

The processor 600 may be a calculation device, a microprocessor, a microcomputer, a CPU (Central Processing Unit), a DSP (Digital Signal Processor), or the like. In addition, as the memory 602, there are exemplified a non-volatile or volatile semiconductor memory such as a RAM (Random Access Memory), a ROM (Read Only Memory), a flash memory, an EPROM (Erasable Programmable ROM), or an EEPROM (Electrically EPROM), a magnetic disk, a flexible disk, an optical disk, a compact disk, a mini disc, a DVD (Digital Versatile Disc).

The memory 602 has stored therein a program for implementing the function of the abnormality determination unit 504. The processor 600 transmits and receives necessary information through the interface 604, and executes the program stored in the memory 602, thereby making it possible to perform the computation processing described above. The result of the computation in the processor 600 can be displayed on the display unit 605. The result of the computation in the processor 600 can also be stored in the memory 602.

The processor 600 and the memory 602 illustrated in FIG. 10 may be replaced by the processing circuit 603 as illustrated in FIG. 11. The processing circuit 603 corresponds to any of a single circuit, a composite circuit, a programmed processor, a parallel-programmed processor, an ASIC (Application Specific Integrated Circuit), an FPGA (Field-Programmable Gate Array), or any combination of them.

The result of the determination in the abnormality determination unit 504 is transmitted to a vehicle-information display device 3A. By doing so, the vehicle-information display device 3A can display the result of the determination in the abnormality determination unit 504.

In a case where the computation unit 20A includes the display unit 605 as illustrated in FIGS. 10 and 11, the result of the determination in the abnormality determination unit 504 can be displayed on the display unit 605. When the date and time of the abnormality determination is recorded in the memory 602, past abnormality records can be displayed on the display unit 605 at the time of inspection at a later date. Based on these conditions, it is possible to perform maintenance and inspection using only the vehicle-driving power converter 1, thereby leading to an advantage in that maintenance work is facilitated.

The monitoring device 50A for an electric vehicle according to the second embodiment does not need any wiring for transmitting a mechanical-angle rotation frequency component, overhead contact line voltage abnormality detection information, and contactor switch-on information to the vehicle-information display device 3A. Thus, an advantageous effect is exerted in that costs for system construction can be reduced.

Third Embodiment

Figure 12:
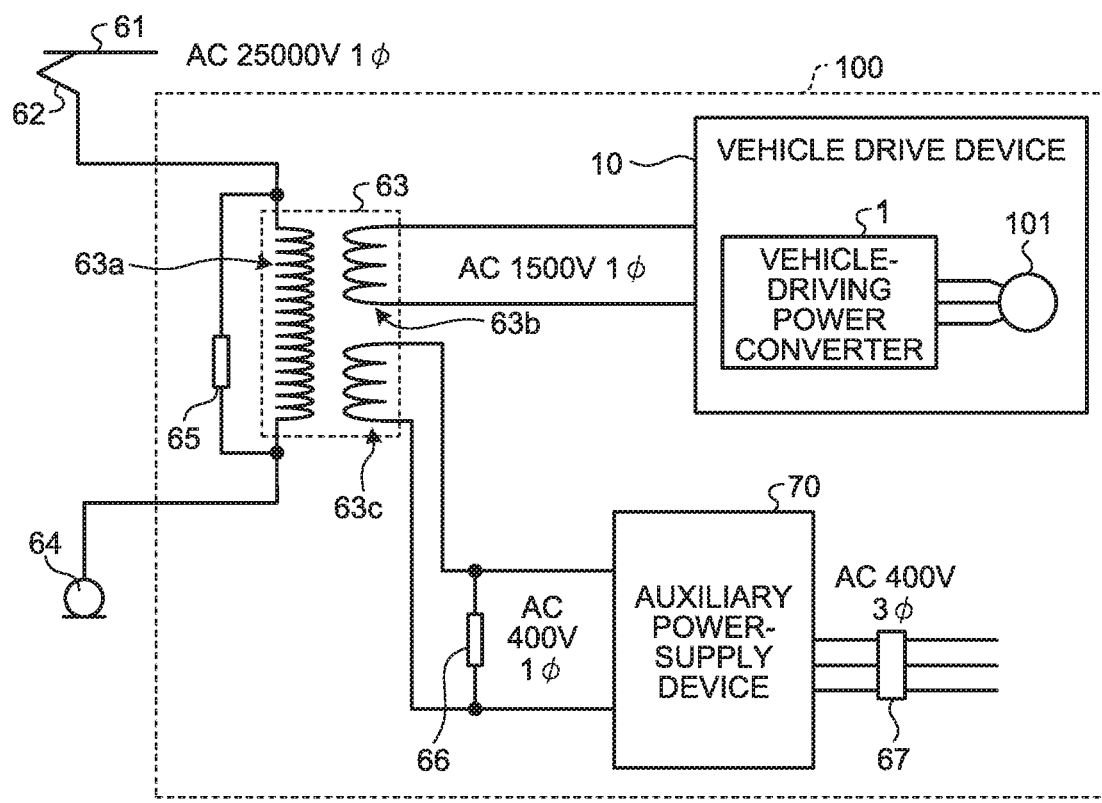
FIG. 12 is an explanatory diagram of a power facility in a third embodiment.
Figure 13:
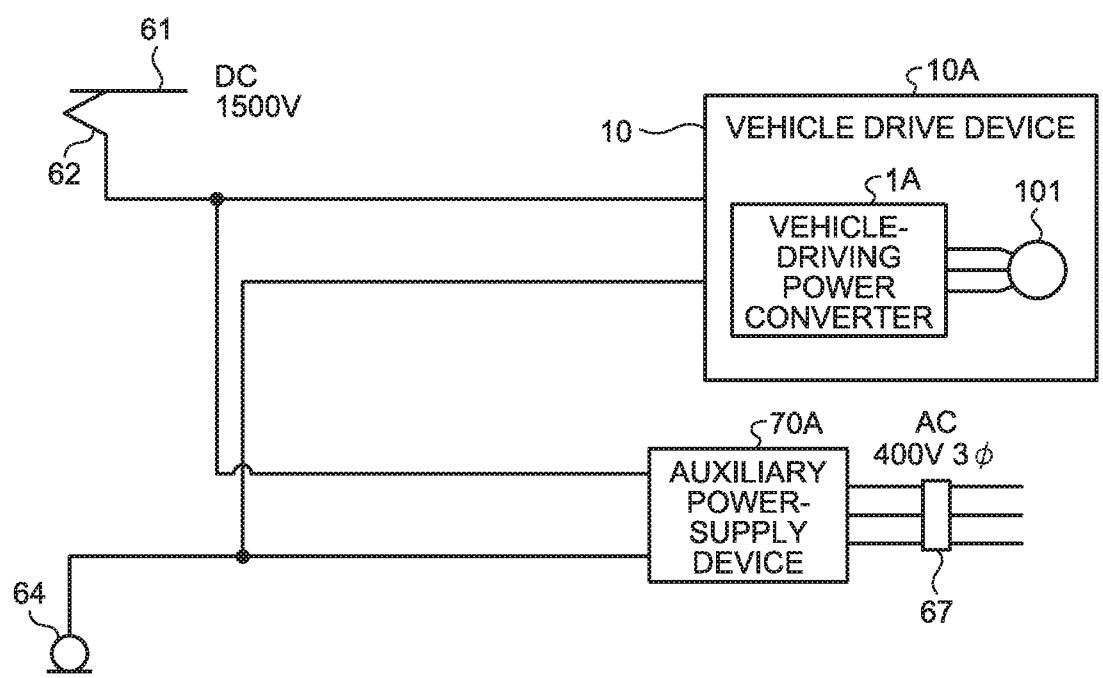
FIG. 13 is an explanatory diagram of a power facility in the third embodiment, which is different from the power facility illustrated in FIG. 12.

In the first embodiment and the second embodiment, a power-supply voltage used for operating a blower is applied directly from the tertiary winding 63c of the vehicle-driving main transformer 63. In a third embodiment, however, an operating power used for operating a blower is supplied from an auxiliary power-supply device. FIG. 12 is an explanatory diagram of a power facility in the third embodiment. FIG. 13 is an explanatory diagram of a power facility in the third embodiment, which is different from the power facility illustrated in FIG. 12. FIG. 12 illustrates an Alternating-Current power facility, while FIG. 13 illustrates a Direct-Current power facility.

In FIG. 12, constituent elements that are identical or equivalent to the constituent elements illustrated in FIG. 2 are denoted by like reference signs. A voltage to be applied to the primary winding 63a and voltages generated by the secondary winding 63b and the tertiary winding 63c are the same as those in the first embodiment, and therefore their descriptions are omitted herein.

An auxiliary power-supply device 70 is connected to the tertiary winding 63c. The auxiliary power-supply device 70 is provided inside an electric vehicle. The auxiliary power-supply device 70 is a power-supply device that supplies an operating power to in-vehicle devices such as an air conditioning device, a compressor, and a brake device, other than the vehicle driving motor 101. The auxiliary power-supply device 70 converts a single-phase Alternating-Current voltage of 400 V to a three-phase Alternating-Current voltage of 400 V. A voltage detector 67 detects a voltage generated by the auxiliary power-supply device 70.

In FIG. 13, constituent elements identical or equivalent to the constituent elements illustrated in FIG. 2 are denoted by like reference signs. A vehicle drive device 10A includes a vehicle-driving power converter 1A and the vehicle driving motor 101. A Direct-Current voltage of 1500 V is applied to the vehicle-driving power converter 1A. An auxiliary power-supply device 70A has the same function as the auxiliary power-supply device 70 in FIG. 12. The auxiliary power-supply device 70A converts a Direct-Current voltage of 1500 V to a three-phase Alternating-Current voltage of 400 V.

Figure 14:
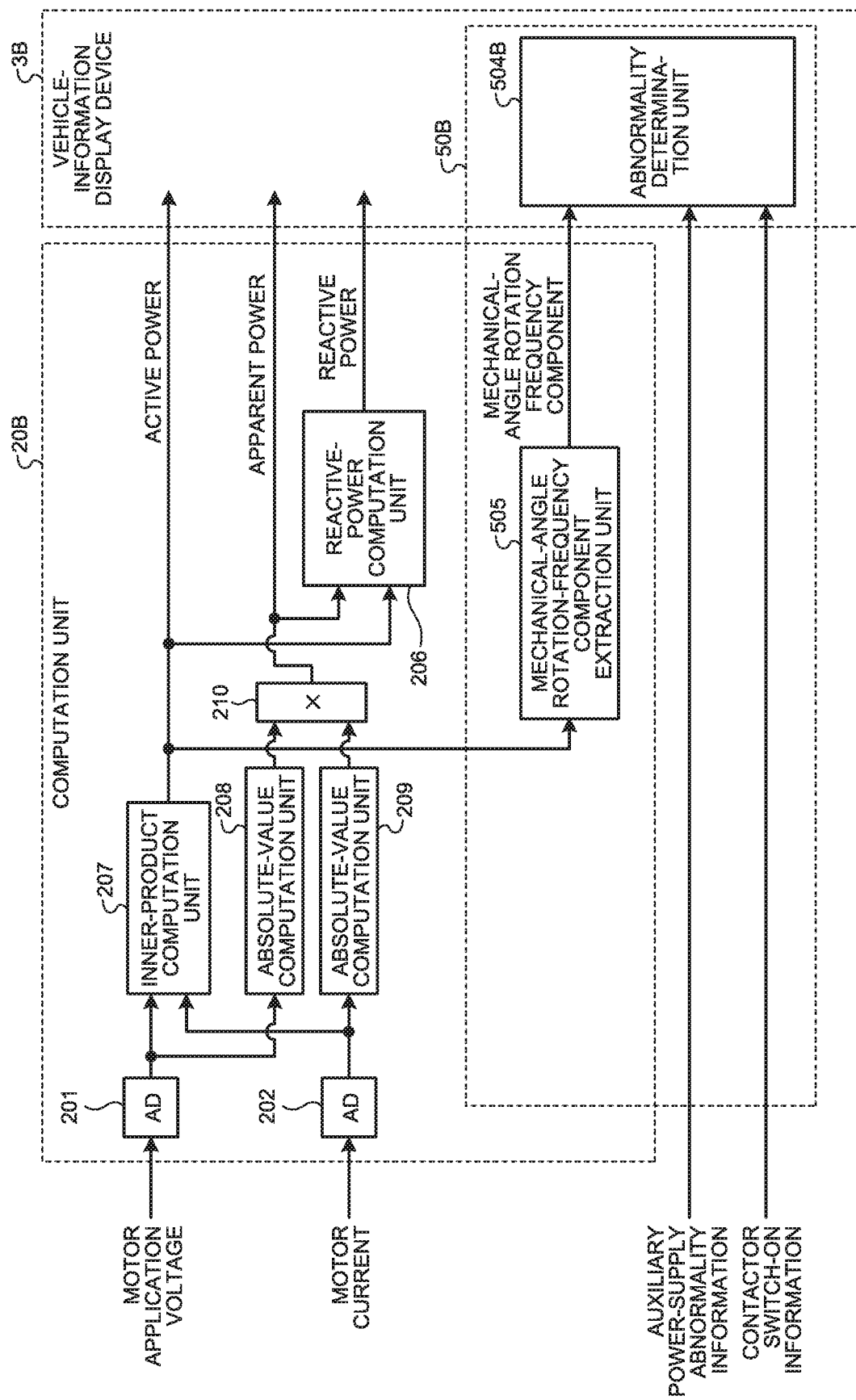
FIG. 14 is an explanatory diagram of a monitoring system for an electric vehicle according to the third embodiment.

FIG. 14 is an explanatory diagram of a monitoring system 50B for an electric vehicle according to the third embodiment. In FIG. 14, constituent elements identical or equivalent to those in the first embodiment illustrated in FIG. 3 are denoted by like reference signs.

In FIG. 14, a computation unit 20B has a configuration in which the mechanical-angle rotation-frequency component extraction unit 501 is replaced with a mechanical-angle rotation-frequency component extraction unit 505 in the computation unit 20 in the first embodiment illustrated in FIG. 3. In addition, a vehicle-information display device 3B has a configuration in which the abnormality determination unit 504 is replaced with an abnormality determination unit 504B in the vehicle-information display device 3 in the first embodiment illustrated in FIG. 3.

In the first embodiment, the mechanical-angle rotation-frequency component extraction unit 501 uses an instantaneous power to obtain a mechanical-angle rotation frequency component, whereas in the third embodiment, the mechanical-angle rotation-frequency component extraction unit 505 uses an active power to obtain a mechanical-angle rotation frequency component.

A motor application voltage and a motor current are inputted to the computation unit 20B. Auxiliary power-supply abnormality information and contactor switch-on information are inputted to the abnormality determination unit 504B in the vehicle-information display device 3B.

A motor application voltage detected by the voltage detector 67 is converted to a digital value by the AD converter 201, and the digital value is then inputted to an inner-product computation unit 207 and an absolute-value computation unit 208. The motor current is converted to a digital value by the AD converter 202, and the digital value is then inputted to the inner-product computation unit 207 and an absolute-value computation unit 209. In the third embodiment, the motor for a blower is a three-phase motor in general. Accordingly, the motor voltage and the motor current have three phases. Therefore, the AD converters 201 and 202 each have conversion parts for three channels, or for two channels in which one channel is omitted with relying on symmetry property of the three-phase Alternating-Current.

The inner-product computation unit 207 performs inner-product computation between the motor application voltage and the motor current. The inner-product computation unit 207 outputs an active power.

An output of the absolute-value computation unit 208 and an output of the absolute-value computation unit 209 are multiplied in a multiplier 210. The multiplier 210 outputs an apparent power.

The reactive-power computation unit 206 uses an active power and an apparent power to generate a reactive power in the same manner as in the first embodiment.

The mechanical-angle rotation-frequency component extraction unit 505 uses the active power generated by the inner-product computation unit 207 to extract a mechanical-angle rotation frequency component where the rotation angle of the motor is expressed in a mechanical angle. The mechanical-angle rotation frequency component extracted by the mechanical-angle rotation-frequency component extraction unit 505 is inputted to the abnormality determination unit 504B.

As described previously, the auxiliary power-supply abnormality information and the contactor switch-on information are inputted to the abnormality determination unit 504B. That is, in the abnormality determination unit 504B, the overhead contact line voltage abnormality detection information that is an input signal for the abnormality determination unit 504 is replaced with auxiliary power-supply abnormality information. The auxiliary power-supply abnormality information and the overhead contact line voltage abnormality detection information both indicate an anomaly in the operating power supply. Therefore, the abnormality determination unit 504B can directly employ the configuration of the abnormality determination unit 504 illustrated in FIG. 4 as it is.

Figure 15:
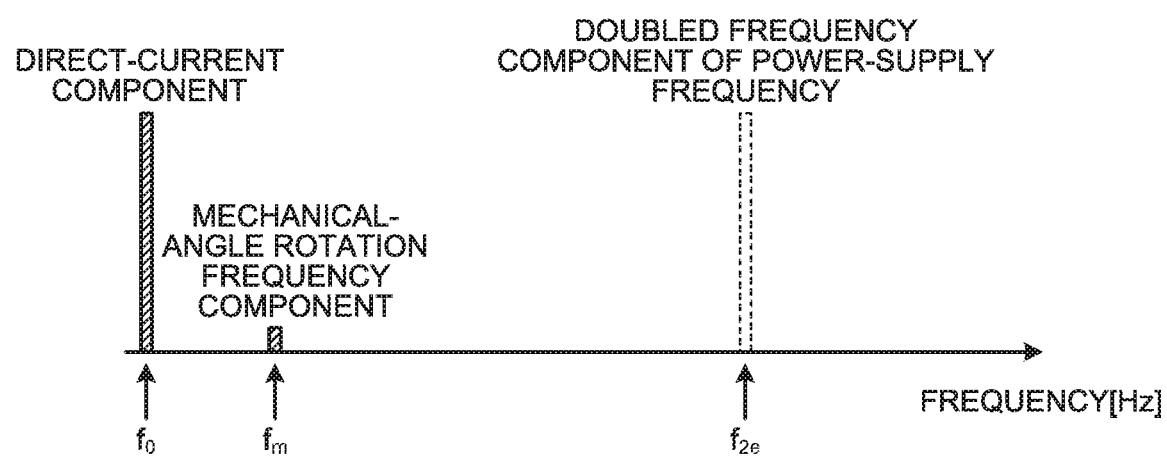
FIG. 15 is a chart schematically illustrating frequency components that appear when frequency analysis is performed on a motor instantaneous electric power where an operating power supply is a three-phase power supply.

FIG. 15 is a chart schematically illustrating frequency components that appear when frequency analysis is performed on a motor instantaneous power where the operating power supply is a three-phase power supply.

In a case where the operating power supply is a three-phase power supply, the doubled frequency component fee of the power-supply frequency is hardly generated as illustrated in FIG. 15. For this reason, the noise level is decreased in the entire frequency range, and the amplitude of the mechanical-angle rotation frequency component $f_m$ is more easily detected as compared to the case of FIG. 5. Therefore, an improvement in detection accuracy can be expected.

The monitoring system 50B for an electric vehicle according to the third embodiment can be constructed with the same configuration as in the first embodiment even when the operating power used for operating the blower is supplied from the auxiliary power-supply device 70 or 70A. Therefore, an advantageous effect is exerted similarly to the first embodiment.

In the monitoring system 50B for an electric vehicle according to the third embodiment, the auxiliary power-supply device 70 or 70A absorbs a difference between the power facilities, and so the monitoring system 50B can obtain an effect of making it possible to employ the similar system configuration regardless of whether the electric vehicle is an Alternating-Current electric vehicle or a Direct-Current electric vehicle.

In the third embodiment, the abnormality determination unit 504B is provided in the vehicle-information display device 3B, but it is also allowable that the abnormality determination unit 504B may be provided in the computation unit 20B in the same manner as in the second embodiment. When the abnormality determination unit 504B is provided in the computation unit 20B, a monitoring device for an electric vehicle can be constructed, and so the same effects as those in the second embodiment can be obtained.

Fourth Embodiment

Figure 16:
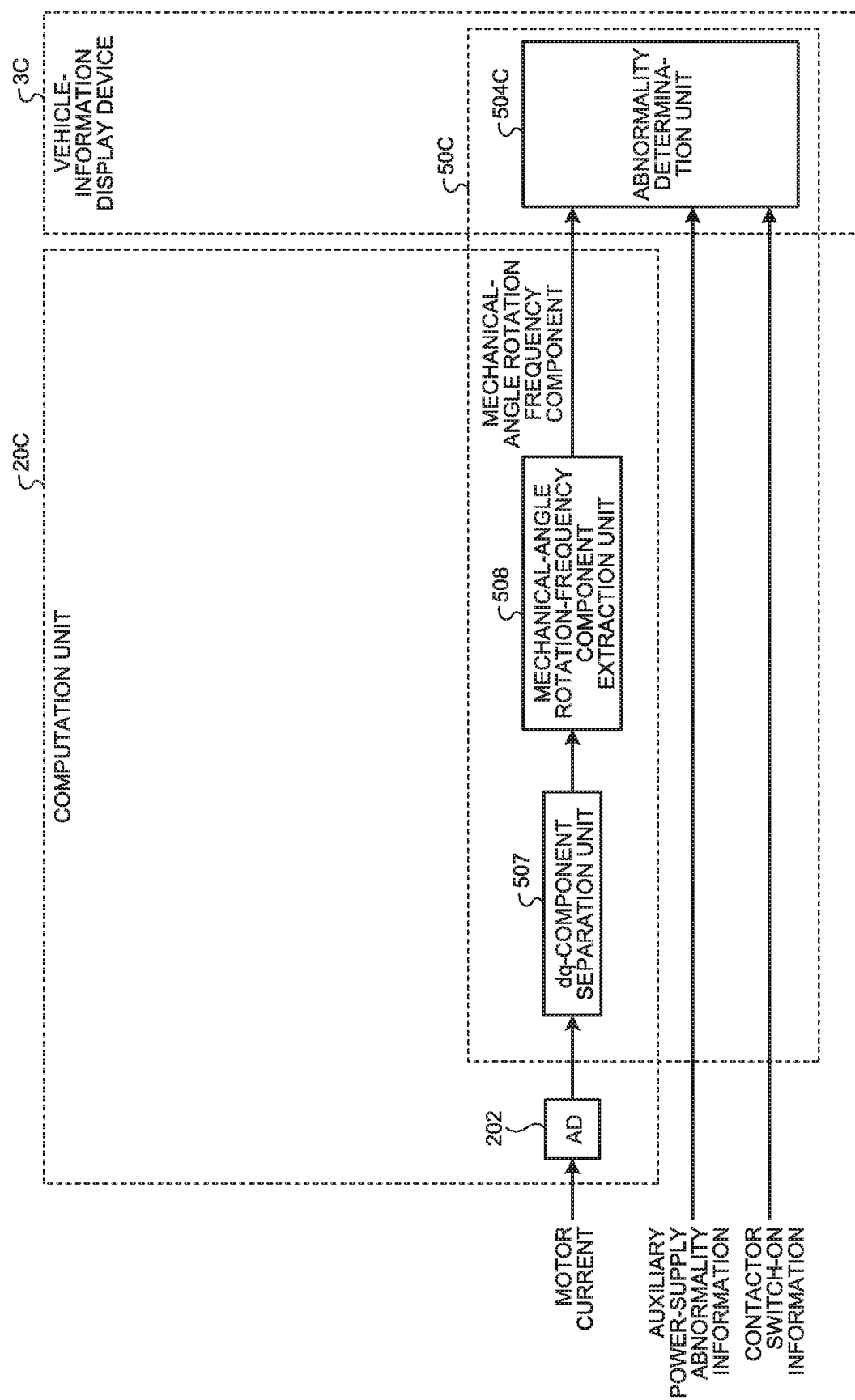
FIG. 16 is an explanatory diagram of a monitoring system for an electric vehicle according to a fourth embodiment.

FIG. 16 is an explanatory diagram of a monitoring system 50C for an electric vehicle according to a fourth embodiment. In the first to third embodiments, information on the motor application voltage and the motor current is used to perform an abnormality determination of the blower, but the fourth embodiment is different from the first to third embodiments in that only information on the motor current is used to perform the abnormality determination on the blower.

A motor current is inputted to a computation unit 20C. Auxiliary power-supply abnormality information and contactor switch-on information are inputted to an abnormality determination unit 504C in a vehicle-information display device 3C.

The motor current is converted to a digital value by the AD converter 202, and the digital value is then inputted to a dq-component separation unit 507.

The dq-component separation unit 507 separates an instantaneous value of the motor current into a d-axis current component and a q-axis current component. A mechanical-angle rotation-frequency component extraction unit 508 extracts a mechanical-angle rotation frequency component where the rotation angle of the motor is expressed in a mechanical angle from an instantaneous value of the q-axis current component. The mechanical-angle rotation frequency component extracted by the mechanical-angle rotation-frequency component extraction unit 508 is inputted to the abnormality determination unit 504C. An operation of the abnormality determination unit 504C is identical or equivalent to the operation of the abnormality determination unit 504B, and therefore its descriptions are omitted.

In a case where the operating power supply is an auxiliary power-supply device, an output voltage of the auxiliary power-supply device is controlled more robustly as compared to an overhead contact line voltage. The robust control means the mechanism or the property by which change in voltage due to the influence of disturbance or environment is prevented. Because an auxiliary power-supply device installed in an electric vehicle has high robustness, its output voltage tends to be changed stably.

For the above reasons, in a case where the operating power supply is an auxiliary power-supply device, it is possible to employ the configuration illustrated in FIG. 16. That is, it is possible to extract a mechanical-angle rotation frequency component without using information on a motor application voltage.

As described above, in the fourth embodiment, the monitoring system 50C is configured to perform an abnormality determination without using information on a motor application voltage. This can simplify the system configuration. Thus, the monitoring system 50C achieves an effect of reducing costs for system construction.

In the fourth embodiment, the abnormality determination unit 504C is provided in the vehicle-information display device 3C, but the abnormality determination unit 504C may be provided in the computation unit 20C in the same manner as in the second embodiment. When the abnormality determination unit 504C is provided in the computation unit 20C, a monitoring device for an electric vehicle can be constructed, thereby leading to the same effects as those in the second embodiment.

Fifth Embodiment

Figure 17:
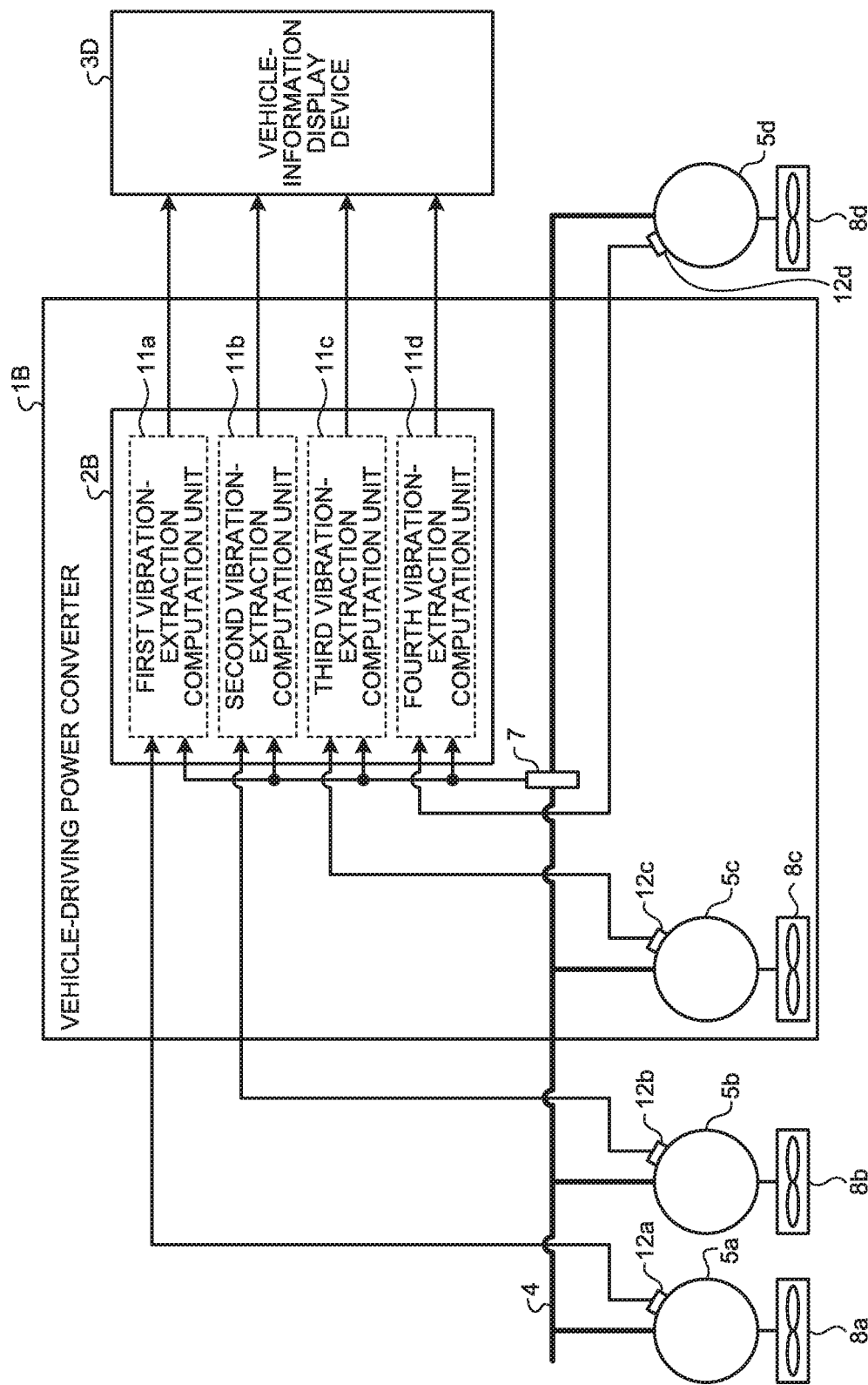
FIG. 17 is a diagram illustrating a configuration of an electric vehicle, which is used to explain a monitoring system for an electric vehicle according to a fifth embodiment.

FIG. 17 is a diagram illustrating a configuration of an electric vehicle 100B used to explain a monitoring system for an electric vehicle according to a fifth embodiment. Constituent elements identical or equivalent to those in the first embodiment illustrated in FIG. 1 are denoted by like reference signs and redundant descriptions thereof are appropriately omitted.

In FIG. 17, the electric vehicle 100B includes a vehicle-driving power converter 1B and a vehicle-information display device 3D. The power wire 4 is laid on in the electric vehicle 100B. The first motor 5a, the second motor 5b, the third motor 5c, and the fourth motor 5d are connected to the power wire 4.

A vibration sensor 12a is mounted on the first motor 5a. A vibration sensor 12b is mounted on the second motor 5b. A vibration sensor 12c is mounted on the third motor 5c. A vibration sensor 12d is mounted on the fourth motor 5d. The vibration sensors detects mechanical vibrations of their respective motors. Each of the vibration sensors outputs a vibration signal including vibration information.

The vehicle-driving power converter 1B includes a computation unit 2B. The computation unit 2B includes a first vibration-extraction computation unit 11a, a second vibration-extraction computation unit 11b, a third vibration-extraction computation unit 11c, and a fourth vibration-extraction computation unit 11d. The first vibration-extraction computation unit 11a, the second vibration-extraction computation unit 11b, the third vibration-extraction computation unit 11c, and the fourth vibration-extraction computation unit 11d are distinguished from each other for the sake of convenience. The computation units may be configured to have their respective parts, or may be configured to share a common part for them.

The voltage detector 7 is located on the power wire 4. The voltage detector 7 detects a voltage to be applied to the power wire 4. The voltage to be applied to the power wire 4 is equivalent to a voltage to be applied to the first motor 5a, the second motor 5b, the third motor 5c, and the fourth motor 5d. The motor application voltage detected by the voltage detector 7 is transmitted to the computation unit 2B.

A motor application voltage detected by the voltage detector 7 and vibration information detected by the vibration sensor 12a are inputted to the first vibration-extraction computation unit 11a. A motor application voltage detected by the voltage detector 7 and vibration information detected by the vibration sensor 12b are inputted to the second vibration-extraction computation unit 11b. A motor application voltage detected by the voltage detector 7 and vibration information detected by the vibration sensor 12c are inputted to the third vibration-extraction computation unit 11c. A motor application voltage detected by the voltage detector 7 and vibration information detected by the vibration sensor 12d are inputted to the fourth vibration-extraction computation unit 11d. Vibration information detected by each of the vibration sensors is hereinafter referred to as a "motor vibration information".

Each of the first vibration-extraction computation unit 11a, the second vibration-extraction computation unit 11b, the third vibration-extraction computation unit 11c, and the fourth vibration-extraction computation unit 11d performs computation described later on the basis of information on the inputted motor application voltage and the inputted motor vibration information. Results of the computation in the first vibration-extraction computation unit 11a, the second vibration-extraction computation unit 11b, the third vibration-extraction computation unit 11c, and the fourth vibration-extraction computation unit 11d are transmitted to the vehicle-information display device 3D.

Figure 18:
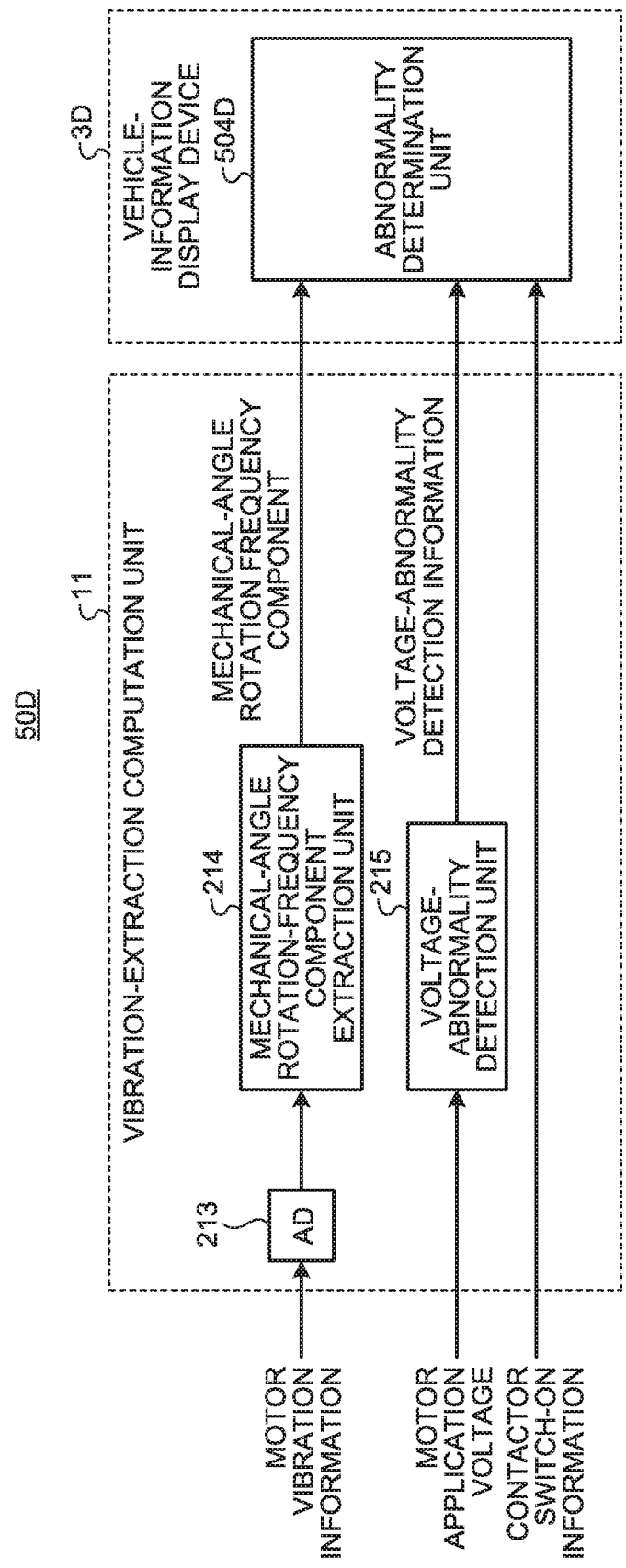
FIG. 18 is a block diagram illustrating a configuration of a monitoring system for an electric vehicle according to the fifth embodiment.

FIG. 18 is a block diagram illustrating a configuration of a monitoring system 50D for an electric vehicle according to the fifth embodiment. In FIG. 18, a vibration-extraction computation unit 11 corresponds to one of the first vibration-extraction computation unit 11a, the second vibration-extraction computation unit 11b, the third vibration-extraction computation unit 11c, and the fourth vibration-extraction computation unit 11d which are illustrated in FIG. 17.

The vibration-extraction computation unit 11 includes an AD converter 213, a mechanical-angle rotation-frequency component extraction unit 214, and a voltage-abnormality detection unit 215. The vehicle-information display device 3D includes an abnormality determination unit 504D.

The monitoring system 50D for an electric vehicle is a system that monitors operations of the first motor 5a, the second motor 5b, the third motor 5c, and the fourth motor 5d. By monitoring the operations of the first motor 5a, the second motor 5b, the third motor 5c, and the fourth motor 5d, the monitoring system 50D for an electric vehicle monitors individual blowers having these motors installed therein, respectively.

Motor vibration information and a motor application voltage are inputted to the vibration-extraction computation unit 11. Contactor switch-on information is inputted to the vehicle-information display device 3D through the vibration-extraction computation unit 11. It is allowable that the contactor switch-on information is inputted to the vehicle-information display device 3D without through the vibration-extraction computation unit 11.

Next, functions of the vibration-extraction computation unit 11 are described. Motor vibration information is converted to a digital value by the AD converter 213, and the digital value is then inputted to the mechanical-angle rotation-frequency component extraction unit 214. The mechanical-angle rotation-frequency component extraction unit 214 extracts a mechanical-angle rotation frequency component included in the motor vibration information having undergone AD conversion. The mechanical-angle rotation frequency component extracted by the mechanical-angle rotation-frequency component extraction unit 214 is inputted to the abnormality determination unit 504D.

The voltage-abnormality detection unit 215 detects a voltage abnormality on the basis of information on a motor application voltage. Voltage abnormality detection information that is the result of the detection of whether or not a motor application voltage is abnormal is inputted to the abnormality determination unit 504D. In FIG. 18, a voltage anomaly is detected using information of a motor application voltage, but it is also allowable that a voltage anomaly is detected using information on an overhead contact line voltage. Assuming that the vehicle-information display device 3D holds therein information on an overhead contact line voltage, the information can be received from the vehicle-information display device 3D. In a case where the vehicle-information display device 3D holds therein information on an overhead contact line voltage, it is allowable to provide the voltage-abnormality detection unit 215 in the vehicle-information display device 3D.

In the abnormality determination unit 504D, overhead contact line voltage abnormality detection information that is an input signal for the abnormality determination unit 504 is replaced with voltage abnormality detection information. The voltage abnormality detection information and the overhead contact line voltage abnormality detection information both indicate an abnormality in the operating power supply. Thus, the abnormality determination unit 504D can directly employ the configuration of the abnormality determination unit 504 illustrated in FIG. 4 as it is.

Figure 19:
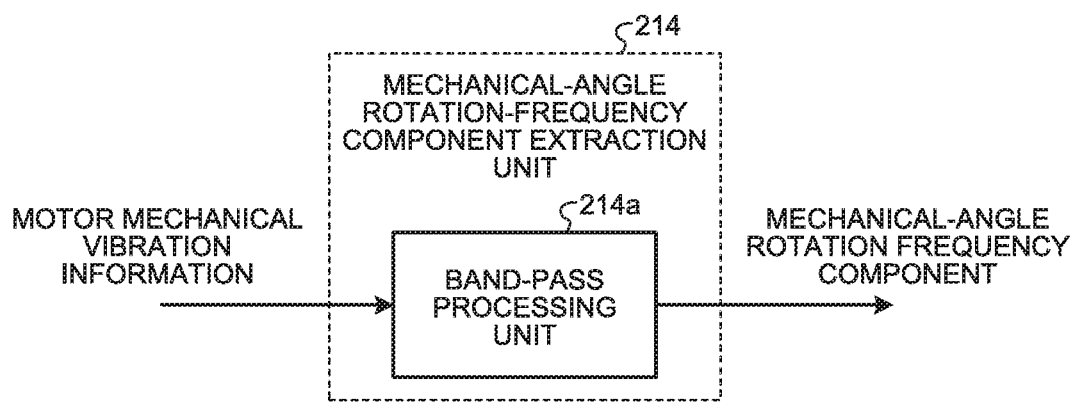
FIG. 19 is a block diagram illustrating a configuration example of a mechanical-angle rotation-frequency component extraction unit illustrated in FIG. 18.
Figure 20:
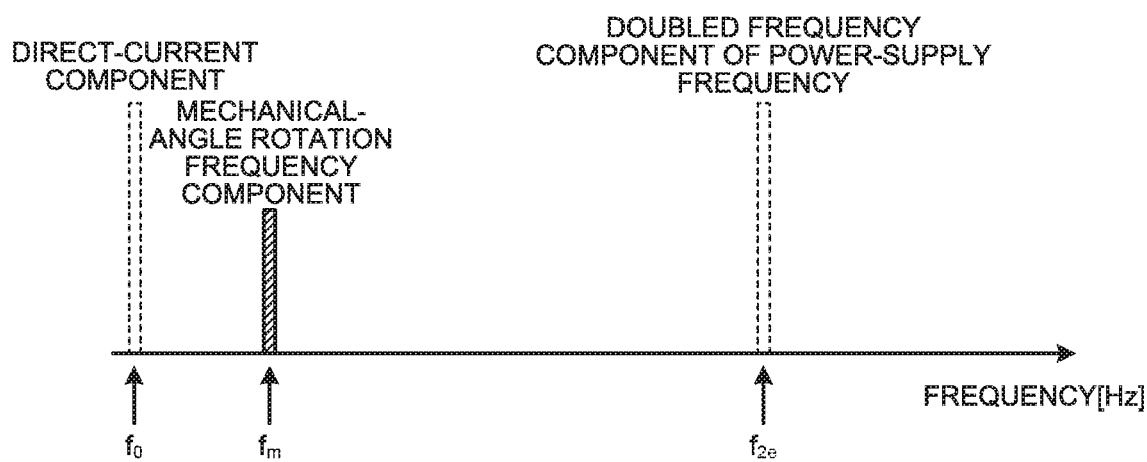
FIG. 20 is a diagram schematically illustrating frequency components that appear when frequency analysis is performed on motor vibration information obtained from a vibration sensor.

FIG. 19 is a block diagram illustrating a configuration example of the mechanical-angle rotation-frequency component extraction unit 214 illustrated in FIG. 18. FIG. 20 is a chart schematically illustrating a frequency components that appear when frequency analysis is performed on motor vibration information obtained from the vibration sensor.

When frequency analysis is performed on the motor vibration information, a mechanical-angle rotation frequency component $f_m$ appears as illustrated in FIG. 20.

The mechanical-angle rotation frequency component $f_m$ is one of the components that show a mechanical anomaly. When an anomaly has occurred in a bearing of a motor of a blower, the mechanical-angle rotation frequency component $f_m$ becomes greater. Also when dust that accumulates on a blade part of the blower is unevenly distributed, the mechanical-angle rotation frequency component $f_m$ becomes greater. The unevenly distributed dust may inhibit smooth rotation of the blower, and rotation sound of the blower may become louder. In this situation, use of the mechanical-angle rotation frequency component $f_m$ enables detection of an anomaly which leads to abnormal sound or fault of the blower.

In a case where a signal of a vibration sensor is analyzed, the doubled frequency component $f_{2e}$ of the power-supply frequency and the Direct-Current component $f_0$ are hardly generated as illustrated in FIG. 20. The noise level is thus decreased in the entire frequency band. As a result, the amplitude of the mechanical-angle rotation frequency component $f_m$ is more easily detected as compared to the case of FIG. 5. Therefore, an improvement in detection accuracy can be expected.

In a case of the motor vibration information, a Direct-Current component $f_0$ is hardly generated differently from a case of the motor application voltage. The noise level is thus decreased in the entire frequency range. Therefore, the amplitude of the mechanical-angle rotation frequency component $f_m$ is more easily detected as compared to the case of FIG. 15. Therefore, a further improvement in detection accuracy can be expected.

As described above, in the fifth embodiment, motor vibration information is used to make it possible to reduce a vibration component that is unnecessary for the detection. Therefore, it is possible to accurately detect an anomaly which leads to abnormal sound or fault of the blower.

In the fifth embodiment, the abnormality determination unit 504D is provided in the vehicle-information display device 3D, but it is also allowable that the abnormality determination unit 504D is provided in the vibration-extraction computation unit 11 in the same manner as in the second embodiment. When the abnormality determination unit 504D is provided in the vibration-extraction computation unit 11, a monitoring device for an electric vehicle can be constructed, and so the same effects as those in the second embodiment can be obtained.

The configurations described in the above embodiments are only examples of the contents of the present invention. These configurations can be combined with other publicly known techniques, and partially omitted and/or modified without departing from the scope of the present invention.

REFERENCE SIGNS LIST 1, 1A, 1B vehicle-driving power converter; 2, 2B, 20, 20A, 20B, 20C computation unit; 3, 3A, 3B, 3C, 3D vehicle-information display device; 4 power wire; 5a first motor; 5b second motor; 5c third motor; 5d fourth motor; 6a, 6b, 6c, 6d current detector; 7, 65, 66, 67 voltage detector; 8a, 8b, 8c, 8d blower; 10, 10A vehicle drive device; 11 vibration-extraction computation unit; 11a first vibration-extraction computation unit; 11b second vibration-extraction computation unit; 11c third vibration-extraction computation unit; 11d fourth vibration-extraction computation unit; 12a, 12b, 12c, 12d vibration sensor; 20a first computation unit; 20b second computation unit; 20c third computation unit; 20d fourth computation unit; 50, 50B, 50C, 50D monitoring system; 50A monitoring device; 61 overhead contact line; 62 current collector; 63 vehicle-driving main transformer; 63a primary winding; 63b secondary winding; 63c tertiary winding; 64 wheel; 70, 70A auxiliary power-supply device; 100, 100B electric vehicle; 101 vehicle driving motor; 201, 202, 213 AD converter; 203, 210, 502 multiplier; 204 low-pass filter; 205 doubled power-supply-frequency component extraction unit; 206 reactive-power computation unit; 207 inner-product computation unit; 208, 209 absolute-value computation unit; 214, 501, 505, 508 mechanical-angle rotation-frequency component extraction unit; 215 voltage-abnormality detection unit; 501a band-pass processing unit; 502a Fourier-series extraction processing unit; 503 overhead contact line voltage abnormality detection unit; 504, 504B, 504C, 504D abnormality determination unit; 504a threshold determination unit; 504b power-supply abnormality-detection-period extension processing unit; 504c contactor switch-off-period extension processing unit; 504d logical multiplication circuit; 504e abnormality-determination accumulation processing unit; 507 dq-component separation unit; 600 processor; 602 memory; 603 processing circuit; 604 interface; 605 display unit.

The invention claimed is:

1. A monitoring device for an electric vehicle to monitor a blower for cooling a device installed in an electric vehicle, the monitoring device comprising:
  a dq-component separation unit to separate an instantaneous value of a motor current into a d-axis current component and a q-axis current component, the motor current flowing to a motor of the blower which operates based on power supplied from an auxiliary power-supply device provided in the electric vehicle;
  an extraction unit to extract a mechanical-angle rotation frequency component from an instantaneous value of the q-axis current component, the mechanical-angle rotation frequency component being a rotation frequency component where a rotation angle of the motor is expressed in a mechanical angle; and
  an abnormality determination unit to determine whether or not the blower is abnormal on the basis of magnitude of the mechanical-angle rotation frequency component.

2. A monitoring device for an electric vehicle to monitor a blower for cooling a device installed in an electric vehicle, the monitoring device comprising:
  an extraction unit to obtain a motor instantaneous power by multiplying an instantaneous value of a motor current flowing to a motor of the blower by an instantaneous value of a motor voltage applied to the motor, and to extract a mechanical-angle rotation frequency component from frequency components included in the motor instantaneous power, the mechanical-angle rotation frequency component being a rotation frequency component where a rotation angle of the motor is expressed in a mechanical angle; and
  an abnormality determination unit to determine whether or not the blower is abnormal on the basis of magnitude of the mechanical-angle rotation frequency component.

3. A monitoring device for an electric vehicle to monitor a blower for cooling a device installed in an electric vehicle, the monitoring device comprising:
  an extraction unit to extract a mechanical-angle rotation frequency component from a plurality of frequency components included in state information indicating a rotational state of a motor of the blower, the mechanical-angle rotation frequency component being a rotation frequency component where a rotation angle of the motor is expressed in a mechanical angle; and
  an abnormality determination unit to determine whether or not the blower is abnormal on the basis of magnitude of the mechanical-angle rotation frequency component,
  wherein the abnormality determination unit receives abnormality detection information that is information indicating abnormality of a power-supply device supplying a power to the blower, and causes an abnormality determination of the blower to remain pending for a preset period when the abnormality detection information indicates a change from abnormality to normality, or receives, from a contactor that supplies a power to the blower, switch-on information of the contactor, and causes an abnormality determination of the blower to remain pending for a preset period when the switch-on information indicates a change from switch-off to switch-on.

4. The monitoring device for an electric vehicle according to claim 1, wherein the extraction unit includes a band-pass processing unit to perform a band-pass filtering process, and the band-pass processing unit extracts the mechanical-angle rotation frequency component.

5. The monitoring device for an electric vehicle according to claim 4, wherein
the motor is an induction motor, and
a frequency is obtained by subtracting either a slip frequency obtained when the motor is operated under a rated-load condition or a rated slip frequency of the induction motor from a power-supply frequency, and then a value calculated by dividing the obtained frequency by the number of pole pairs of the induction motor is set as a center frequency of the band-pass processing unit.

6. The monitoring device for an electric vehicle according to claim 1, wherein the extraction unit extracts the mechanical-angle rotation frequency component by Fourier-series extraction computation.

7. The monitoring device for an electric vehicle according to claim 6, wherein
the motor is an induction motor, and
Fourier-series extraction computation is performed with a frequency being obtained by subtracting either a slip frequency obtained when the motor is operated under a rated-load condition or a rated slip frequency of the induction motor from a power-supply frequency, and with a value calculated by dividing the obtained frequency by the number of pole pairs of the induction motor being set as a prescribed frequency.

8. The monitoring device for an electric vehicle according to claim 1, wherein the abnormality determination unit determines that the blower is abnormal when a mechanical-angle rotation frequency component extracted by the extraction unit exceeds a preset threshold, or the abnormality determination unit integrates a mechanical-angle rotation frequency component extracted by the extraction unit, and determines that the blower is abnormal when a value of integral obtained by the integration exceeds a preset threshold.

9. The monitoring device for an electric vehicle according to claim 1, wherein when the abnormality determination unit determines that the blower is abnormal, the abnormality determination unit records date and time when an abnormality is determined or displays the date and time on a display unit.

10. The monitoring device for an electric vehicle according to claim 1, wherein the abnormality determination unit receives abnormality detection information on an output voltage of the auxiliary power-supply device, and causes an abnormality determination of the blower to remain pending for a preset period when the abnormality detection information indicates a change from abnormality to normality, or the abnormality determination unit receives, from a contactor that supplies a power to the blower, switch-on information of the contactor, and causes an abnormality determination of the blower to remain pending for a preset period when the switch-on information indicates a change from switch-off to switch-on.

11. The monitoring device for an electric vehicle according to claim 2, wherein the extraction unit includes a band-pass processing unit to perform a band-pass filtering process, and the band-pass processing unit extracts the mechanical-angle rotation frequency component.

12. The monitoring device for an electric vehicle according to claim 11, wherein
the motor is an induction motor, and
a frequency is obtained by subtracting either a slip frequency obtained when the motor is operated under a rated-load condition or a rated slip frequency of the induction motor from a power-supply frequency, and then a value calculated by dividing the obtained frequency by the number of pole pairs of the induction motor is set as a center frequency of the band-pass processing unit.

13. The monitoring device for an electric vehicle according to claim 2, wherein the extraction unit extracts the mechanical-angle rotation frequency component by Fourier-series extraction computation.

14. The monitoring device for an electric vehicle according to claim 13, wherein
the motor is an induction motor, and
Fourier-series extraction computation is performed with a frequency being obtained by subtracting either a slip frequency obtained when the motor is operated under a rated-load condition or a rated slip frequency of the induction motor from a power-supply frequency, and with a value calculated by dividing the obtained frequency by the number of pole pairs of the induction motor being set as a prescribed frequency.

15. The monitoring device for an electric vehicle according to claim 2, wherein the abnormality determination unit determines that the blower is abnormal when a mechanical-angle rotation frequency component extracted by the extraction unit exceeds a preset threshold, or the abnormality determination unit integrates a mechanical-angle rotation frequency component extracted by the extraction unit, and determines that the blower is abnormal when a value of integral obtained by the integration exceeds a preset threshold.

16. The monitoring device for an electric vehicle according to claim 3, wherein the abnormality determination unit determines that the blower is abnormal when a mechanical-angle rotation frequency component extracted by the extraction unit exceeds a preset threshold, or the abnormality determination unit integrates a mechanical-angle rotation frequency component extracted by the extraction unit, and determines that the blower is abnormal when a value of integral obtained by the integration exceeds a preset threshold.

17. The monitoring device for an electric vehicle according to claim 2, wherein when the abnormality determination unit determines that the blower is abnormal, the abnormality determination unit records date and time when an abnormality is determined or displays the date and time on a display unit.

18. The monitoring device for an electric vehicle according to claim 2, wherein the abnormality determination unit receives abnormality detection information of an output voltage of a main-transformer auxiliary winding that supplies a power to the blower, and causes an abnormality determination of the blower to remain pending for a preset period when the abnormality detection information indicates a change from abnormality to normality, or the abnormality determination unit receives, from a contactor that supplies a power to the blower, switch-on information of the contactor, and causes an abnormality determination of the blower to remain pending for a preset period when the switch-on information indicates a change from switch-off to switch-on.

19. The monitoring device for an electric vehicle according to claim 2, wherein the device is at least one of an electric-vehicle driving motor, an electric-vehicle driving main transformer, and a power converter that controls the electric-vehicle driving motor.

20. The monitoring device for an electric vehicle according to claim 3, wherein, in a case where the abnormality detection information corresponds to abnormality and the switch-on information corresponds to switch-on, the abnormality determination unit determines that the blower is abnormal when the mechanical-angle rotation frequency component extracted by the extraction unit exceeds a preset threshold, or the abnormality determination unit integrates a mechanical-angle rotation frequency component extracted by the extraction unit, and determines that the blower is abnormal when a value of integral obtained by the integration exceeds a preset threshold.

* * * * *